United States Patent
Arai

(10) Patent No.: US 9,324,410 B2
(45) Date of Patent: Apr. 26, 2016

(54) SEMICONDUCTOR MEMORY DEVICE HAVING AN OUTPUT BUFFER CONTROLLER

(71) Applicant: Micron Technology, Inc., Boise, ID (US)

(72) Inventor: Tetsuya Arai, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/476,186

(22) Filed: Sep. 3, 2014

(65) Prior Publication Data

US 2015/0063041 A1    Mar. 5, 2015

(30) Foreign Application Priority Data

Sep. 3, 2013   (JP) .................................. 2013-182183

(51) Int. Cl.
  *G11C 7/10*   (2006.01)
  *G11C 11/4093*   (2006.01)

(52) U.S. Cl.
  CPC .......... *G11C 11/4093* (2013.01); *G11C 7/1051* (2013.01); *G11C 7/1057* (2013.01); *G11C 2207/2254* (2013.01)

(58) Field of Classification Search
  CPC ...................................................... G11C 7/1051
  USPC ........................................ 326/30; 365/189.05
  See application file for complete search history.

(56) References Cited

U.S. PATENT DOCUMENTS

| | | | |
|---|---|---|---|
| 7,656,186 B2 * | 2/2010 | Osanai et al. | 326/30 |
| 7,893,710 B2 * | 2/2011 | Lee | 326/30 |
| 8,106,676 B2 * | 1/2012 | Kaiwa et al. | 326/30 |
| 8,344,751 B2 * | 1/2013 | Cho | 326/30 |
| 8,878,565 B2 * | 11/2014 | Hara | 326/30 |
| 2015/0022282 A1 * | 1/2015 | Kaneko et al. | 333/103 |

* cited by examiner

*Primary Examiner* — Son Mai
(74) *Attorney, Agent, or Firm* — Schwegman Lundberg & Woessner, P.A.

(57) ABSTRACT

A device includes a data output terminal, an output buffer including n first transistors (n is a natural number greater than 1) connected in parallel with the data output terminal, and a calibration circuit to output an n-bit first code signal for controlling each of the n first transistors. In some embodiments, the calibration circuit includes a first counter circuit to output a k-bit second code signal (k is a natural number less than n), and a first code conversion circuit to convert the k-bit second code signal to the n-bit first code signal. Additional apparatus, systems, and methods are disclosed.

19 Claims, 17 Drawing Sheets

| PreCODE | | CODE | |
|---|---|---|---|
| INPUT VALUE (Decimal) | INPUT VALUE (Binary) | OUTPUT VALUE (Decimal) | OUTPUT VALUE (Binary) |
| 0 | 00000 | 0 | 0000000 |
| 1 | 00001 | 1 | 0000001 |
| 2 | 00010 | 2 | 0000010 |
| 3 | 00011 | 3 | 0000011 |
| 4 | 00100 | 4 | 0000100 |
| 5 | 00101 | 5 | 0000101 |
| 6 | 00110 | 6 | 0000110 |
| 7 | 00111 | 7 | 0000111 |
| 8 | 01000 | 8 | 0001000 |
| 9 | 01001 | 9 | 0001001 |
| 10 | 01010 | 10 | 0001010 |
| 11 | 01011 | 11 | 0001011 |
| 12 | 01100 | 12 | 0001100 |
| 13 | 01101 | 13 | 0001101 |
| 14 | 01110 | 14 | 0001110 |
| 15 | 01111 | 15 | 0001111 |
| 16 | 10000 | 17 | 0010001 |
| 17 | 10001 | 19 | 0010011 |
| 18 | 10010 | 21 | 0010101 |
| 19 | 10011 | 23 | 0010111 |
| 20 | 10100 | 27 | 0011011 |
| 21 | 10101 | 31 | 0011111 |
| 22 | 10110 | 35 | 0100011 |
| 23 | 10111 | 39 | 0100111 |
| 24 | 11000 | 43 | 0101011 |
| 25 | 11001 | 47 | 0101111 |
| 26 | 11010 | 55 | 0110111 |
| 27 | 11011 | 63 | 0111111 |
| 28 | 11100 | 79 | 1001111 |
| 29 | 11101 | 95 | 1011111 |
| 30 | 11110 | 111 | 1101111 |
| 31 | 11111 | 127 | 1111111 |

SEMICONDUCTOR MEMORY DEVICE HAVING AN OUTPUT BUFFER CONTROLLER

PRIORITY APPLICATION

This application is based upon and claims the benefit of priority from Japanese patent application No. 2013-182183, filed on Sep. 3, 2013, the disclosure of which is incorporated herein by reference in its entirety.

BACKGROUND

Some semiconductor devices, such as DRAM (Dynamic Random Access Memory) devices, include an output buffer.

BRIEF DESCRIPTION OF THE DRAWINGS

The features and advantages of the various embodiments will be more apparent from the following description, taken in conjunction with the accompanying drawings, in which:

FIG. 9 is a table showing the relationship between a five-bit code signal PreCODE and a seven-bit code signal CODE, according to various embodiments;

DETAILED DESCRIPTION

In some embodiments, a semiconductor device, such as DRAM (Dynamic Random Access Memory), may include an output buffer capable of impedance adjustment. The impedance adjustment of the output buffer can be made by using a calibration circuit to perform a calibration operation to generate a code signal and then supplying the code signal to the output buffer.

The output buffer may include a plurality of transistors connected in parallel. By controlling each transistor based on each bit of the code signal in such a way that the transistor is turned ON or OFF, an impedance corresponding to the value of the code signal can be obtained. Readers that desire to learn more about related devices may refer to Japanese Patent Application Laid-open No. 2008-219865 and Japanese Patent Application Laid-open No. 2009-118480.

For example, in a semiconductor device described in Japanese Patent Application Laid-open No. 2008-219865, the code signal is of an N+1-bit structure. Therefore, the impedance of an output buffer having N+1 transistors can be adjusted. Accordingly, in order to increase the accuracy of impedance adjustment of the output buffer, the number of bits of the code signal may be increased to reduce an adjustment pitch.

However, if the number of bits of the code signal is increased, the calibration operation might take more time as the number of selectable values of impedance increases. That is, there is a trade-off relationship between the accuracy of impedance adjustment and the time used for the calibration operation. Therefore, it is difficult to achieve both a high level of impedance-adjustment accuracy and high-speed operation. Accordingly, some embodiments may provide a semiconductor device that can perform the calibration operation in a short time, while maintaining a relatively high level of impedance-adjustment accuracy. Systems that includes the semiconductor device are also described.

Figure 15:
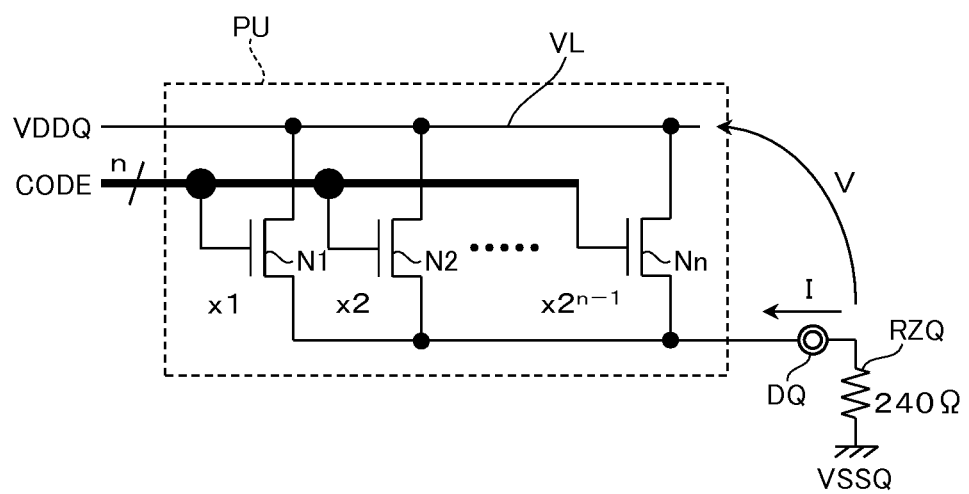
FIG. 15 is a circuit diagram showing an embodiment of a pull-up unit PU included in an output buffer, according to various embodiments.

Referring now to FIG. 15, the pull-up unit PU includes, for example, N-channel MOS transistors N1 to Nn; the number of the N-channel MOS transistors N1 to Nn is n. The transistors N1 to Nn are connected in parallel between a power supply line VL and a data output terminal DQ. The power supply line VL supplies a power supply potential VDDQ. The power supply line VL is connected in common to drains of the transistors N1 to Nn. The data output terminal DQ outputs read data to the outside. The data output terminal DQ is connected in common to sources of the transistors N1 to Nn. The data output terminal DQ is terminated at a ground potential VSSQ via a 240Ω resistor RZQ, which is provided outside.

The ratios (W/L ratios) of channel width (W) to channel length (L) of the transistors N1 to Nn, or current supply capacities, are weighted by the power of 2. In some embodiments, if the W/L ratio of the transistor N1 is 1WLn, the transistors are so designed that: the W/L ratio of the transistor Ni (i=1 to n) is $2^{n-1} \times$ WLn. To the gate electrodes of the transistors N1 to Nn, corresponding ones of n bits that constitute a code signal CODE are supplied. Therefore, the transistors N1 to Nn can be separately controlled in such a way as to be turned ON/OFF.

By separately controlling the transistors N1 to Nn based on the code signal CODE in such a way that the transistors N1 to Nn are turned ON/OFF, the level of read data when the pull-up unit PU is activated is controlled so as to become an output level VOH. The output level VOH is a potential that indicates high level (logical value=1), and is greater than the ground potential VSSQ and less than the power supply potential VDDQ.

Figure 16A:
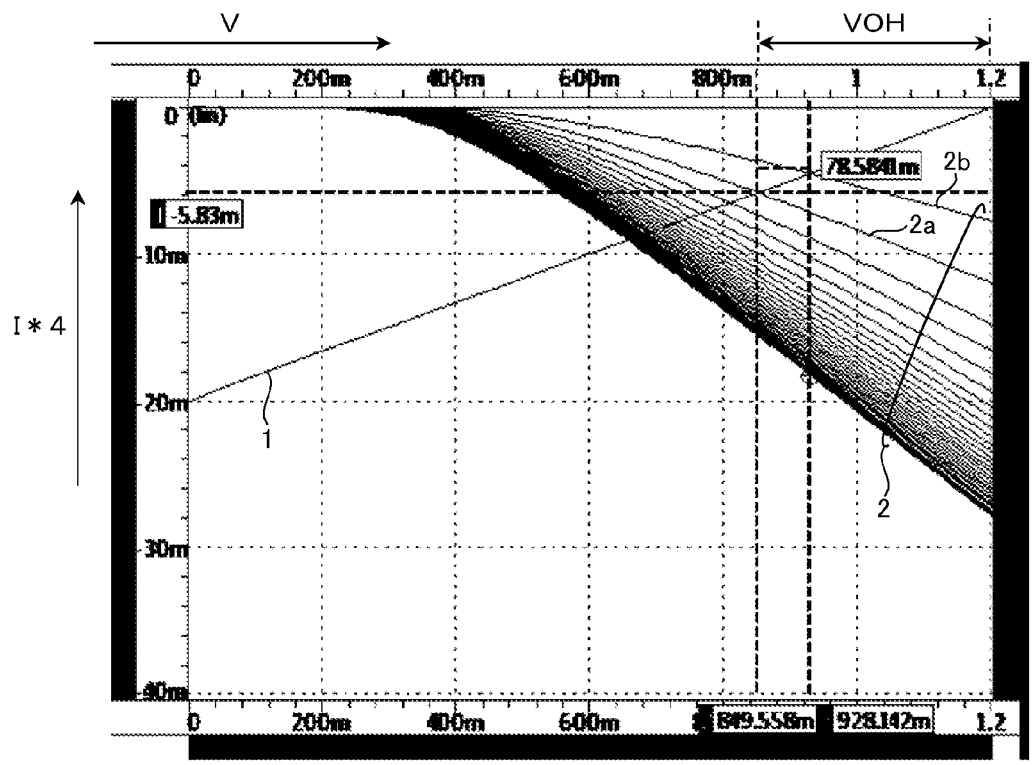
FIG. 16A is a graph showing the relationship between the value of a code signal CODE and current I that flows thorough a data output terminal DQ when the code signal CODE includes five bits (n=5), according to various embodiments.
Figure 16B:
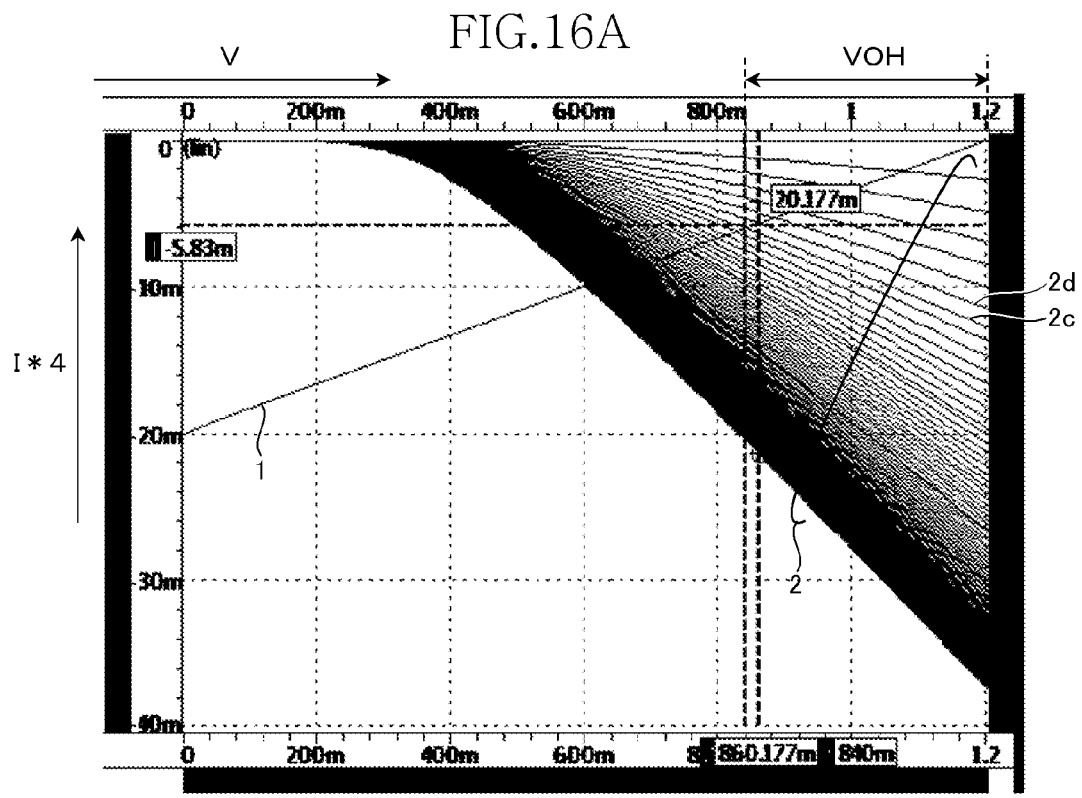
FIG. 16B is a graph showing the relationship between the value of a code signal CODE and a current I that flows thorough a data output terminal DQ when the code signal CODE includes seven bits (n=7), according to various embodiments.

Turning to FIG. 16, the horizontal axis represents a potential, and the vertical axis represents a current; in order to make the diagrams easy to understand, the value of the current is quadrupled. Moreover, the straight line indicated by reference symbol 1 represents the current-voltage characteristics of the resistor RZQ. A plurality of curved lines indicated by reference symbol 2 represent the current-voltage characteristics of the pull-up unit PU. As shown in FIG. 16, the current-voltage characteristics of the resistor RZQ are constant. However, the current-voltage characteristics of the pull-up unit PU vary depending on the value of the code signal CODE. In the embodiment shown in FIG. 16A, n=5, which means that the current-voltage characteristics of the pull-up unit PU can be controlled in 32 stages ($=2^5$). In the embodiment shown in FIG. 16B, n=7, which means that the current-voltage characteristics of the pull-up unit PU can be controlled in 128 stages ($=2^7$).

The intersections of the straight line indicated by reference symbol 1 and the curved lines indicated by reference symbol 2 are potentials of the output level VOH. Accordingly, by changing the value of the code signal CODE, the potential of the output level VOH can be changed.

As clearly shown in FIG. 16, in order to control the potential of the output level VOH with improved accuracy, the number (n) of bits of the code signal CODE is increased. For example, compared with the case where n=5 (FIG. 16A), when n=7 (FIG. 16B), the accuracy is ideally quadrupled.

In one embodiment, the code signal CODE is changed by one pitch, and the current-voltage characteristics are therefore shifted from a curved line 2a to a curved line 2b as shown in FIG. 16A. In this case, the output level VOH is changed by about 78.6 mV. If the current-voltage characteristics are shifted from a curved line 2c to a curved line 2d as shown in FIG. 16B, the output level VOH is changed by about 20.2 mV.

If the number (n) of bits of the code signal CODE increases, the number of selectable values of the impedance increases accordingly, and the calibration operation therefore takes more time. For example, compared with the case where n=5 (FIG. 16A), when n=7 (FIG. 16B), the calibration time needs to be quadrupled to perform linear scanning, or needs to be about 1.4 times greater to perform binary scanning. In this manner, there is a trade-off relationship between the accuracy of the output level VOH and the calibration time.

Here, studies have been focused on the unevenness of the change of the potential associated with the changing code signal CODE, which becomes emphasized particularly in such cases as when the characteristics of a target element are non-linear. More specifically, as the value of the code signal CODE becomes smaller, or as the value of the current I that flows becomes smaller in response to an increase in the impedance of the pull-up unit PU, a change in the output level VOH will become larger when the code signal CODE is changed by one pitch. As the value of the code signal CODE becomes larger, or as the value of the current I that flows becomes larger in response to a decrease in the impedance of the pull-up unit PU, a change in the output level VOH will become smaller when the code signal CODE is changed by one pitch.

In this manner, in a region where the impedance of the pull-up unit PU is high, a change in the output level VOH will be large when the code signal CODE is changed. In a region where the impedance of the pull-up unit PU is low, a change in the output level VOH will be small when the code signal CODE is changed. Accordingly, if the number n of bits of the code signal CODE is determined based on the accuracy in the region where the impedance of the pull-up unit PU is high, the accuracy will be higher in the region where the impedance of the pull-up unit PU is low, requiring a longer calibration time. If the number n of bits of the code signal CODE is selected based on the accuracy in the region where the impedance of the pull-up unit PU is low, the accuracy will be lower in the region where the impedance of the pull-up unit PU is high.

Hereinafter, several embodiments of the invention will be described. The following detailed description refers to the accompanying drawings that show, by way of illustration, specific aspects and embodiments which may be practiced. These embodiments are described in sufficient detail to enable those of ordinary skill in the art to practice them. Other embodiments may be utilized, and structure, logical and electrical changes may be made without departing from the scope of the present disclosure. The various embodiments disclosed herein are not necessarily mutually exclusive, as some disclosed embodiments can be combined with one or more other disclosed embodiments to form new embodiments.

Figure 1:
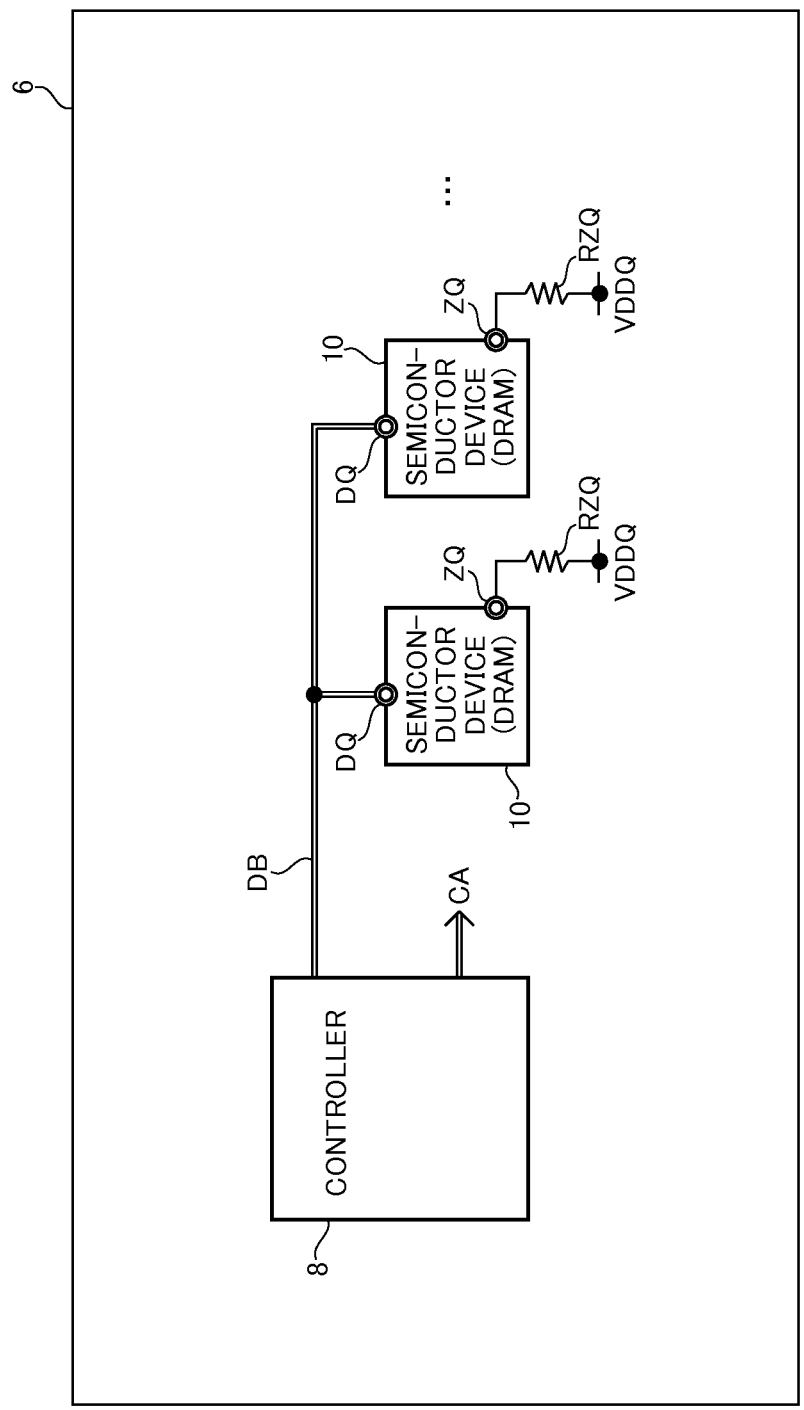
FIG. 1 is a block diagram showing the configuration of a system including semiconductor devices, according to various embodiments.

Referring now to FIG. 1, the system 6 includes a plurality of semiconductor devices 10, and a controller 8, which controls the semiconductor devices 10. In some embodiments, the semiconductor devices 10 include DRAMs, and carry out a read operation and a write operation based on a command address signal CA supplied from the controller 8. During the read operation, the read data output from data input/output terminals DQ of the semiconductor devices 10 are supplied to the controller 8 via a data bus DB. During the write operation, the write data output from the controller 8 are supplied to the data input/output terminals DQ of the semiconductor devices 10 via the data bus DB. As shown in FIG. 1, the data bus DB is connected in common to a plurality of the semiconductor devices 10.

Incidentally, the semiconductor devices disclosed herein may not necessarily be semiconductor devices to which data can be input (or which are capable of write operation). These semiconductor devices may include semiconductor memory devices such as ROMs, which are only capable of outputting data (or which are only capable of performing a read operation). In this case, instead of both data input/output terminals, data output terminals are used.

In the semiconductor device 10, a calibration terminal ZQ is provided. The calibration terminal ZQ is connected to a power supply potential VDDQ via a reference resistor RZQ, which is provided on a memory module substrate or a motherboard. The reference resistor RZQ includes a resistor that is referenced during a calibration operation, and will be described later. Incidentally, in this specification, a resistance value of the reference resistor RZQ may also be referred to as "RZQ". Resistance values of other elements or circuits will also be referred to as "RZQ" if the resistance values of those elements or circuits are equal to the resistance value of the reference resistor RZQ.

Figure 2:
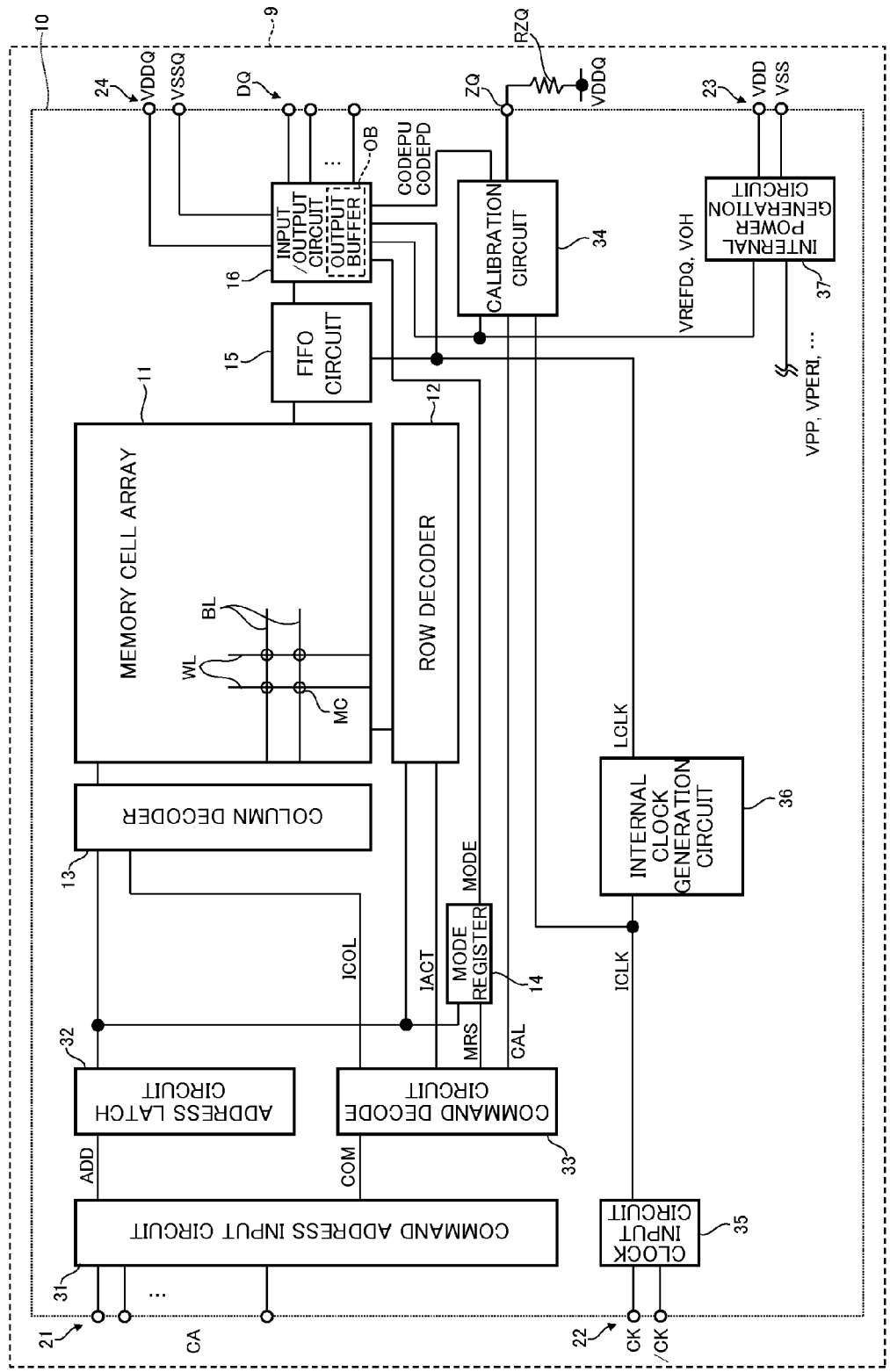
FIG. 2 is a block diagram showing a possible overall configuration of the semiconductor device as shown in FIG. 1.

Turning to FIG. 2, the semiconductor device 10 includes a DRAM of a LPDDR4 (Low Power Double Data Rate 4) type, which is integrated on a single semiconductor chip. The semiconductor device 10 is mounted on an external substrate 9.

The external substrate 9 includes a memory module substrate or a motherboard on which a reference resistor RZQ is provided. As described above, the reference resistor RZQ is connected to a calibration terminal ZQ of the semiconductor device 10, and the impedance thereof is used as a reference impedance for a calibration circuit 34.

As shown in FIG. 2, the semiconductor device 10 includes a memory cell array 11. The memory cell array 11 includes a plurality of word lines WL and a plurality of bit lines BL. At the intersections of the lines, memory cells MC are disposed. The word lines WL are selected by a row decoder 12, and the bit lines BL are selected by a column decoder 13.

The semiconductor device 10 includes the following external terminals: command address terminals 21, clock terminals 22, data input/output terminals DQ, power supply terminals 23 and 24, and the calibration terminal ZQ.

The command address terminals 21 are supplied with a command address signal CA from the outside. The command address signal CA contains an address signal ADD and a command signal COM. The address signal ADD is supplied to an address latch circuit 32 via a command address input circuit 31. The address signal ADD latched by the address latch circuit 32 is supplied to the row decoder 12, the column decoder 13, or a mode register 14. The mode register 14 includes a circuit, in which a parameter indicating operation mode of the semiconductor device 10 is set.

The command signal COM is supplied to a command decode circuit 33 via the command address input circuit 31. The command decode circuit 33 includes a circuit that generates various internal commands by decoding the command signal COM. The internal commands include an active signal IACT, a column signal ICOL, a mode register set signal MRS, and a calibration signal CAL.

The active signal IACT includes a signal that is activated when the command signal COM indicates row access (active command). After the active signal IACT is activated, the address signal ADD latched by the address latch circuit 32 is supplied to the row decoder 12. As a result, a word line WL specified by the address signal ADD is selected.

The column signal ICOL is a signal that is activated when the command signal COM indicates column access (read or write command). After the column signal ICOL is activated, the address signal ADD latched by the address latch circuit 32 is supplied to the column decoder 13. As a result, a bit line BL specified by the address signal ADD is selected.

If the active command and the read command are input, and the row address and the column address are input in synchronization with the above commands, the read data will be read out from a memory cell MC specified by the row and column addresses. The read data is output to the outside from a plurality of data input/output terminals DQ via a FIFO circuit 15 and an input/output circuit 16.

If the active command and the write command are input, and the row address and the column address are input in synchronization with the above commands, and then the write data is input to a plurality of data input/output terminals DQ, the write data is supplied to the memory cell array 11 via the input/output circuit 16 and the FIFO circuit 15, and is written into a memory cell MC specified by the row and column addresses.

The mode register set signal MRS includes a signal that is activated when the command signal COM indicates a mode register set command. If the mode register set command is input, and a mode signal is input from the command address terminals 21 in synchronization with the above command, then the values that are set in the mode register 14 can be rewritten. Of the values set in the mode register 14, a mode signal MODE is supplied to the input/output circuit 16.

The calibration signal CAL includes a signal that is activated when the command signal COM indicates a calibration command. When the calibration signal CAL is activated, the calibration circuit 34 starts a calibration operation to generate code signals CODEPU and CODEPD. The circuit configuration of the calibration circuit 34 and the calibration operation will be described later.

Returning to the explanation of the external terminals provided in the semiconductor device 10, to the clock terminals 22, external clock signals CK and /CK are input. The external clock signals CK and /CK are complementary to each other, and both are supplied to a clock input circuit 35. The clock input circuit 35 receives the external clock signals CK and /CK to generate an internal clock signal ICLK. The internal clock signal ICLK is supplied to an internal clock generation circuit 36. As a result, an internal clock signal LCLK for inputting and outputting of data is generated. The internal clock signal LCLK is supplied to the FIFO circuit 15 and the input/output circuit 16, and is used as a timing signal for determining the output timing of the read data or the input timing of the write data. Moreover, the internal clock signal ICLK is supplied to various circuit blocks (such as the calibration circuit 34), and defines the operation timing of those circuit blocks.

The power supply terminals 23 are supplied with the power supply potentials VDD and VSS from the outside. The power supply potentials VDD and VSS that are supplied to the power supply terminals 23 are supplied to an internal power generation circuit 37. The internal power generation circuit 37 generates various internal potentials (such as VPP and VPERI), and reference potentials VREFDQ and VOH based on the power supply potentials VDD and VSS. The internal potential VPP includes a potential that is mainly used in the row decoder 12. The internal potential VPERI includes a potential that is used in many other circuit blocks. Meanwhile, the reference potentials VREFDQ and VOH include reference potentials that are used in the calibration circuit 34.

Power supply terminals 24 are supplied with power supply potentials VDDQ and VSSQ from the outside. The power supply potentials VDDQ and VSSQ that are supplied to the power supply terminals 24 are supplied to an output buffer in the input/output circuit 16, and the output buffer is used to drive the data input/output terminals DQ. The power supply potentials VDDQ and VSSQ are respectively equal to the power supply potentials VDD and VSS, which are supplied to the power supply terminals 23. In order to prevent the power supply noise caused by the input/output circuit 16 from propagating to other circuit blocks, the input/output circuit 16 uses the dedicated power supply potentials VDDQ and VSSQ.

The calibration terminal ZQ is connected to the calibration circuit 34. When the calibration circuit 34 is activated by the calibration signal CAL, the calibration circuit 34 performs a calibration operation by referencing the impedance of the external reference resistor RZQ and the reference potentials VREFDQ and VOH. The code signals CODEPU and CODEPD that are obtained by the calibration operation are supplied to the input/output circuit 16. As a result, the impedance of the output buffer OB in the input/output circuit 16 is specified.

Figure 3:
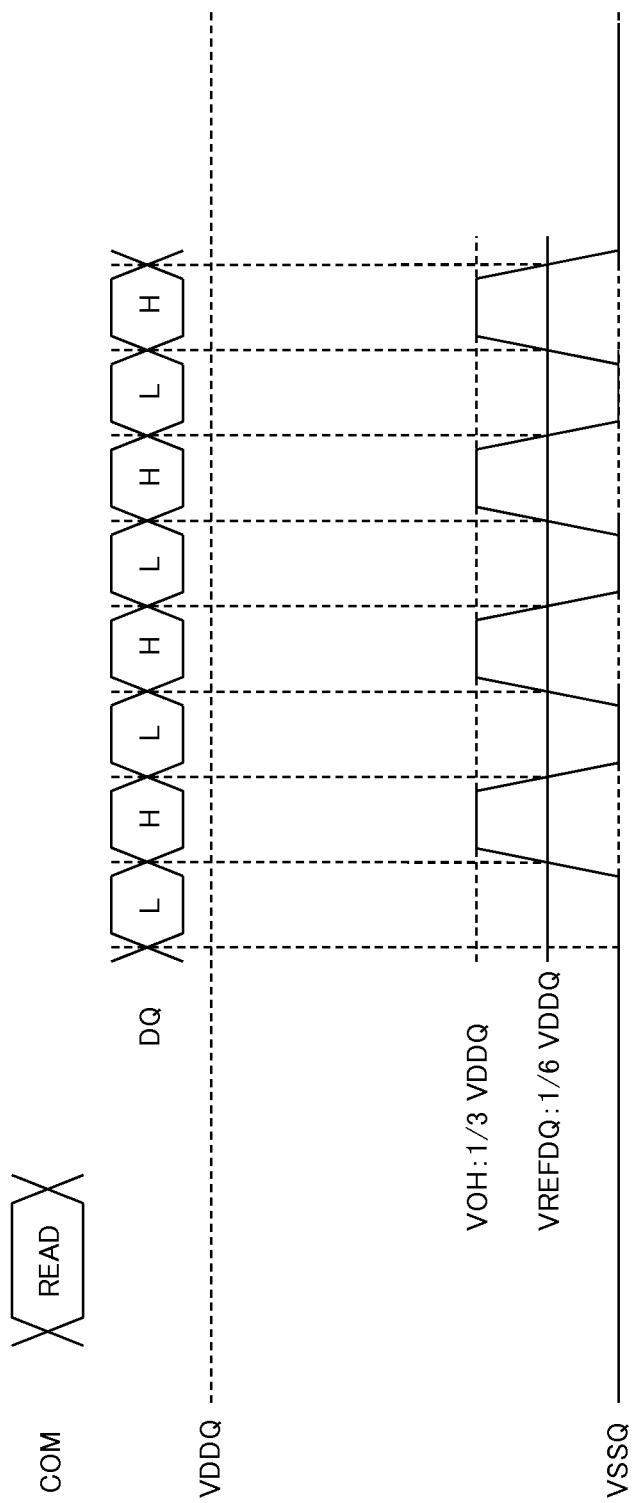
FIG. 3 is a waveform chart showing the operation of the semiconductor device as shown in FIG. 1 during the read operation.

Turning to FIG. 3, when a read command READ is input via the command address terminals 21, the read data are output in a burst mode from the data input/output terminals DQ after a predetermined latency has passed. Incidentally, FIG. 3 shows the read data that is output from one of a plurality of the data input/output terminals DQ.

The read data includes a binary signal. In the embodiment as shown in FIG. 3, the read data of the low level (L) and that of the high level (H) are alternately output. In this case, more specifically, the potential of the low level (L) is VSSQ, and the potential of the high level (H) is VOH. VOH is at a level of VDDQ/3. Moreover, VDDQ/6, which is an intermediate potential between the low level (L) or VSSQ and the high level (H) or VDDQ/3, is a reference potential VREFDQ, which serves as a threshold value.

Figure 4A:
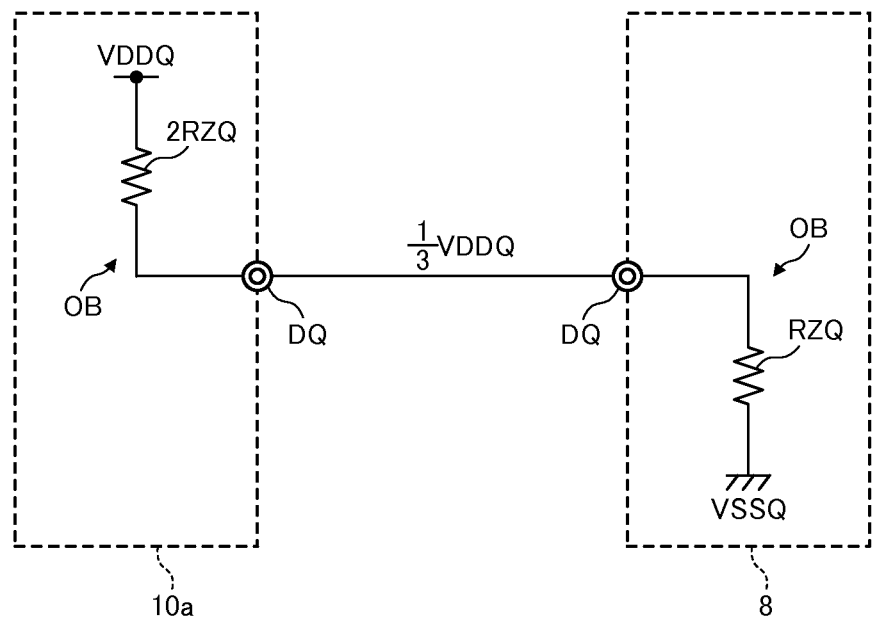
FIG. 4A is a schematic diagram explaining a method that makes the level of read data VDDQ/3, according to various embodiments.

In order to actually output the low-level (L) read data, the data input/output terminals DQ are driven to the VSSQ level. In order to actually output the high-level (H) read data, as shown in FIG. 4A, the data input/output terminals DQ of a semiconductor device 10a that performs a read operation are driven to the VDDQ level, and the data input/output terminals DQ of the controller 8 that performs a termination operation are driven to the VSSQ level. At this time, if the impedance of the output buffer OB in the semiconductor device 10a that performs the read operation is 2RZQ, and the impedance of the output buffer OB in the controller 8 that performs the termination operation are RZQ, the level of the read data is VDDQ/3.

Figure 4B:
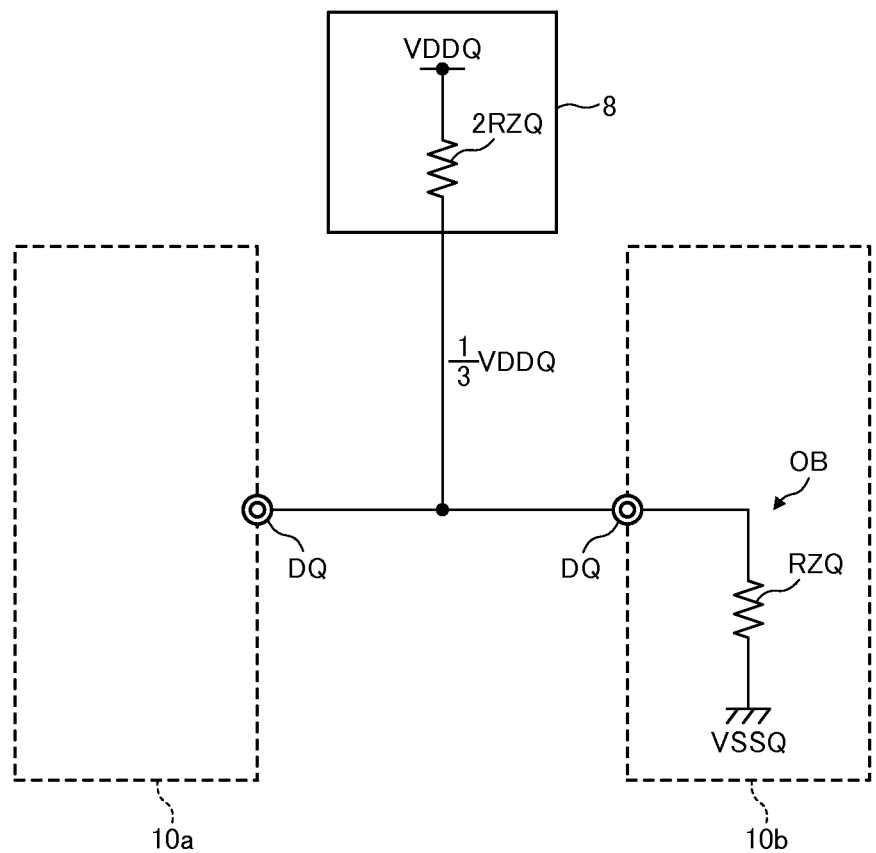
FIG. 4B is a schematic diagram explaining a method that makes the level of write data VDDQ/3, according to various embodiments.

Similarly, during a write operation for the semiconductor device 10a, as shown in FIG. 4B, the impedance of the output buffer OB in a semiconductor device 10b that performs a termination operation is set to RZQ and is driven to the VSSQ level, and the impedance of the output buffer of the controller 8 is set to 2RZQ and is driven to the VDDQ level. In this case, instead of the semiconductor device 10b, the semiconductor device 10a that receives the write operation may perform the termination operation itself.

Figure 5:
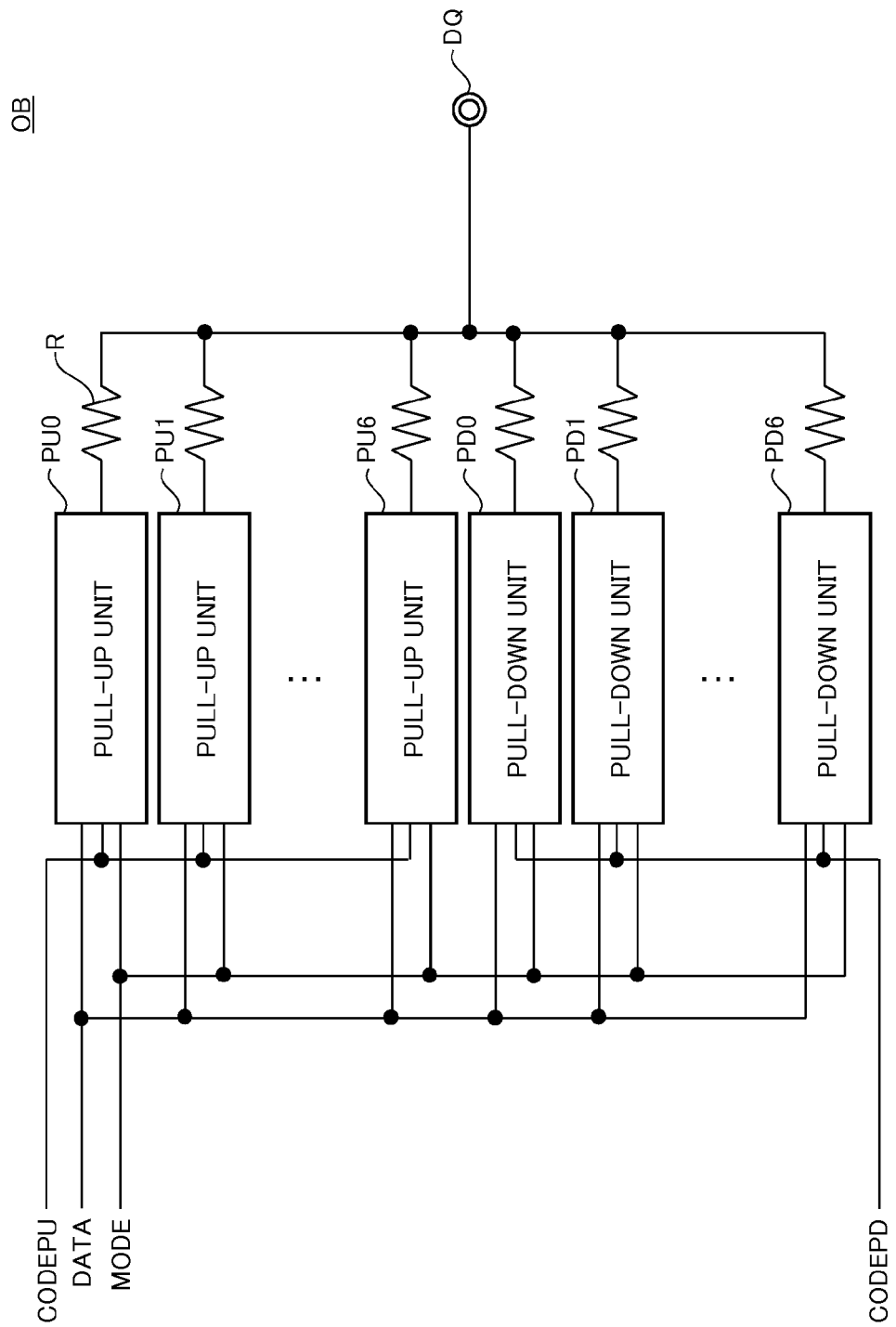
FIG. 5 is a block diagram showing an output buffer in an input/output circuit as shown in FIG. 2, in which a portion allocated to one data input/output terminal DQ is shown.

Turning to FIG. 5, the output buffer OB includes seven pull-up units PU0 to PU6 and seven pull-down units PD0 to PD6 for one data input/output terminal DQ. Output nodes of the pull-up units PU0 to PU6 and pull-down units PD0 to PD6 are connected in common to a corresponding data input/output terminal DQ via resistors R. The pull-up units PU0 to PU6 have the same circuit configuration, and are collectively referred to as "pull-up units PU" when no distinction is required. Similarly, the pull-down units PD0 to PD6 have the same circuit configuration, and are collectively referred to as "pull-down units PD" when no distinction is required.

The pull-up unit PUi (i=0 to 6) and the pull-down unit PDi (i=0 to 6) are paired. The number of the pairs of the units to be used is specified by the mode signal MODE output from the mode register 14. To the pull-up units PU0 to PU6 and pull-down units PD0 to PD6, the internal data DATA is supplied from the FIFO circuit 15. If the internal data DATA indicates a high level, one or more pull-up units specified by the mode signal MODE among the pull-up units PU0 to PU6 will be activated. As a result, the data input/output terminal DQ is driven to a high level. When the internal data DATA indicates a low level, one or more pull-down units specified by the mode signal MODE among the pull-down units PD0 to PD6 will be activated. As a result, the data input/output terminal DQ is driven to a low level.

The impedance of each of the activated pull-up units PU0 to PU6 is specified by the code signal CODEPU. Similarly, the impedance of each of the activated pull-down units PD0 to PD6 is specified by the code signal CODEPD.

According to various embodiments, the impedance target value of the pull-up units PU0 to PU6 is 2RZQ. The impedance target value of the pull-down units PD0 to PD6 is RZQ. Accordingly, if j pairs of the units are used as specified by the mode signal MODE, the impedance at the time of high-level outputting is 2RZQ/j, and the impedance at the time of low-level outputting is RZQ/j.

Figure 6:
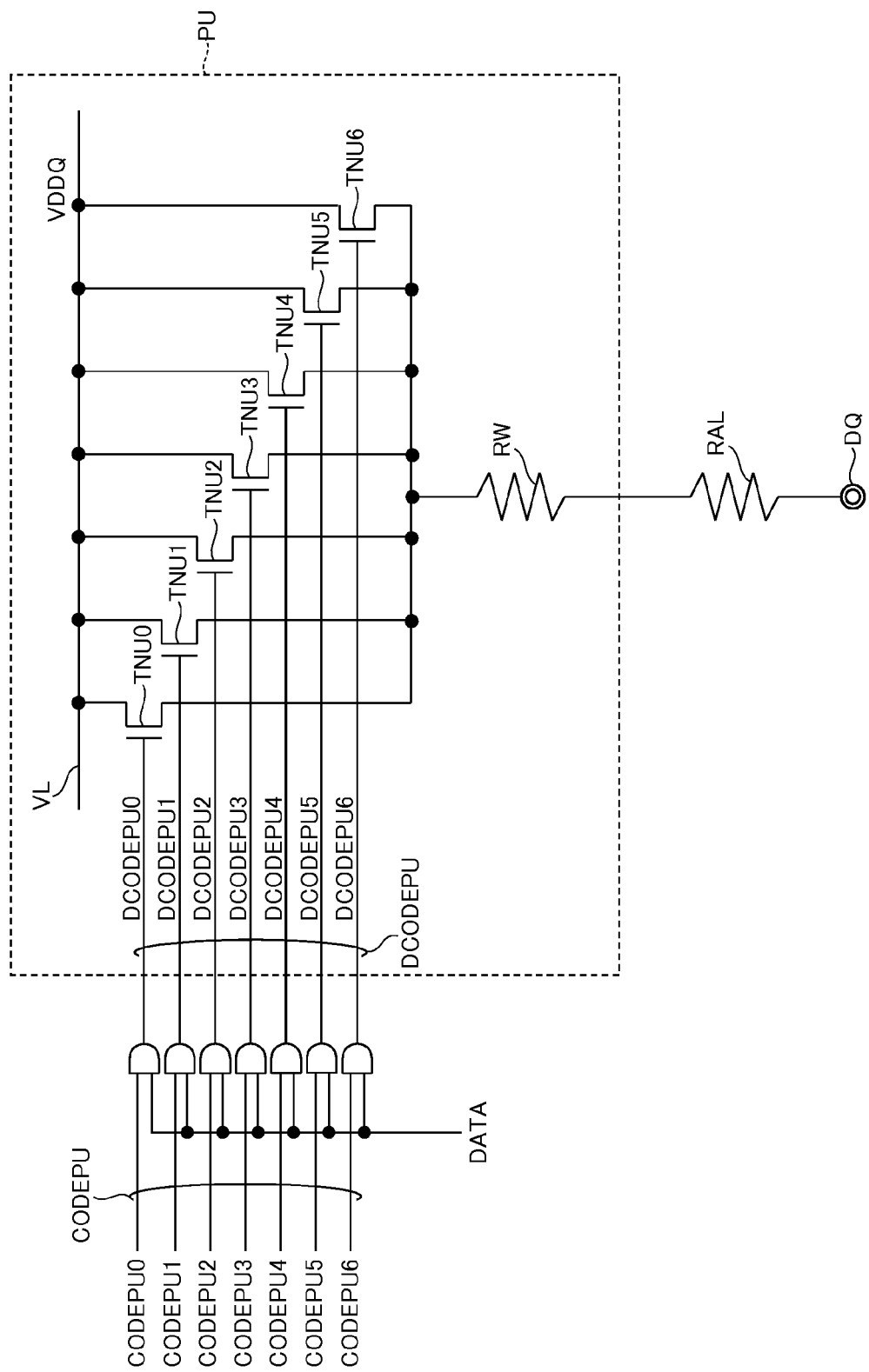
FIG. 6 is a circuit diagram showing an embodiment of a pull-up unit PU as shown in FIG. 5.

Turning to FIG. 6, the pull-up unit PU includes seven N-channel MOS transistors TNU0 to TNU6 (which are connected in parallel), and resistors RW and RAL. The drains of the transistors TNU0 to TNU6 are connected in common to a power supply line VL, which supplies the power supply potential VDDQ. The sources of the transistors TNU0 to TNU6 are connected to the data input/output terminals DQ via the resistors RW and RAL. The resistor RW is made of tungsten wire or the like, and is about 120Ω, for example. The resistor RAL is made of aluminum wire or the like, and is a small resistor that is less than or equal to 1Ω, for example.

To the gate electrodes of the transistors TNU0 to TNU6, DCODEPU0 to DCODEPU6 that are bits constituting the code control signal DCODEPU are respectively supplied. Accordingly, the seven transistors TNU0 to TNU6 are separately controlled based on the value of the code control signal DCODEPU in such a way as to be turned ON/OFF. As shown in FIG. 6, the code control signal DCODEPU includes a signal that AND gate circuits have generated by logically combining each bit of the code signal CODEPU and the internal data DATA. When the internal data DATA indicates low level, all the bits DCODEPU0 to DCODEPU6 that constitute the code control signal DCODEPU are at a low level regardless of what the value of the code signal CODEPU is. As a result, all the transistors TNU0 to TNU6 are OFF. When the internal data DATA indicates a high level, the value of the code signal CODEPU is directly used as the value of the code control signal DCODEPU. As a result, some of the transistors TNU0 to TNU6 are ON.

In this case, the ratios (W/L ratios) of the channel width (W) to the channel length (L) of the transistors TNU0 to TNU6 (or their current supply capacities) are weighted by the power of 2. More specifically, if the W/L ratio of the transistor TNU0 is 1WLnu, the W/L ratio of the transistor TNUk (k=0 to 6) is designed so as to be $2^k \times$WLnu. Therefore, the impedance of the pull-up unit PU can be adjusted in up to 128 stages. However, according to the present embodiment, the number of adjustable values of the impedance of the pull-up unit PU is thinned out to 32 stages.

Figure 7:
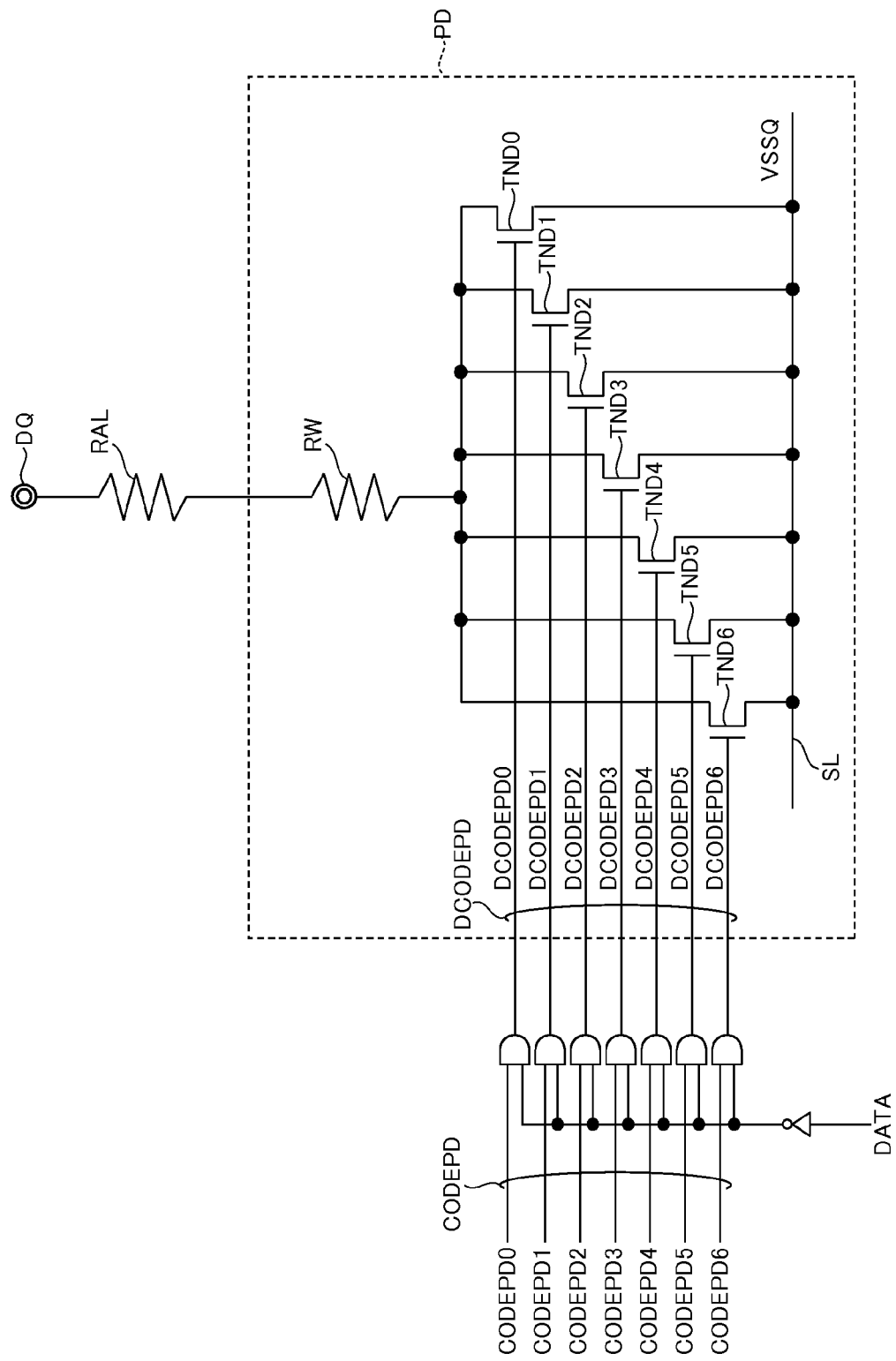
FIG. 7 is a circuit diagram showing an embodiment of a pull-down unit PD as shown in FIG. 5.

Turning to FIG. 7, the pull-down unit PD includes seven N-channel MOS transistors TND0 to TND6 (which are connected in parallel), and resistors RW and RAL. The sources of the transistors TND0 to TND6 are connected in common to a power supply line SL, which supplies ground potential VSSQ. The drains of the transistors TND0 to TND6 are connected to the data input/output terminals DQ via the resistors RW and RAL.

To the gate electrodes of the transistors TND0 to TND6, DCODEPD0 to DCODEPD6 that are bits constituting the code control signal DCODEPD are respectively supplied. Therefore, the seven transistors TND0 to TND6 are separately controlled based on the value of the code control signal DCODEPD in such a way as to be turned ON/OFF. As shown in FIG. 7, the code control signal DCODEPD is a signal that AND gate circuits have generated by logically combining each bit of the code signal CODEPD and an inverted signal of the internal data DATA. When the internal data DATA indicates a high level, all the bits DCODEPD0 to DCODEPD6 that constitute the code control signal DCODEPD are at a low level regardless of what the value of the code signal CODEPD is. As a result, all the transistors TND0 to TND6 are OFF. When the internal data DATA indicates a low level, the value of the code signal CODEPD is directly used as the value of the code control signal DCODEPD. As a result, some of the transistors TND0 to TND6 are ON.

In this case, the ratios (W/L ratios) of the channel width (W) to the channel length (L) of the transistors TND0 to TND6 (or their current supply capacities) are weighted by the power of 2. More specifically, if the W/L ratio of the transistor TND0 is 1WLnd, the W/L ratio of the transistor TNDk (k=0 to 6) is designed so as to be $2^k \times$WLnd. Therefore, the impedance of the pull-down unit PD can be adjusted in 128 stages. However, according to the present embodiment, the number of adjustable values of the impedance of the pull-down unit PD is thinned out to 32 stages.

In that manner, the impedance of the pull-up unit PU and pull-down unit PD is adjusted based on the code signals CODEPU and CODEPD, respectively. The code signals CODEPU and CODEPD are generated by a calibration operation performed by the calibration circuit 34 as shown in FIG. 1.

Figure 8:
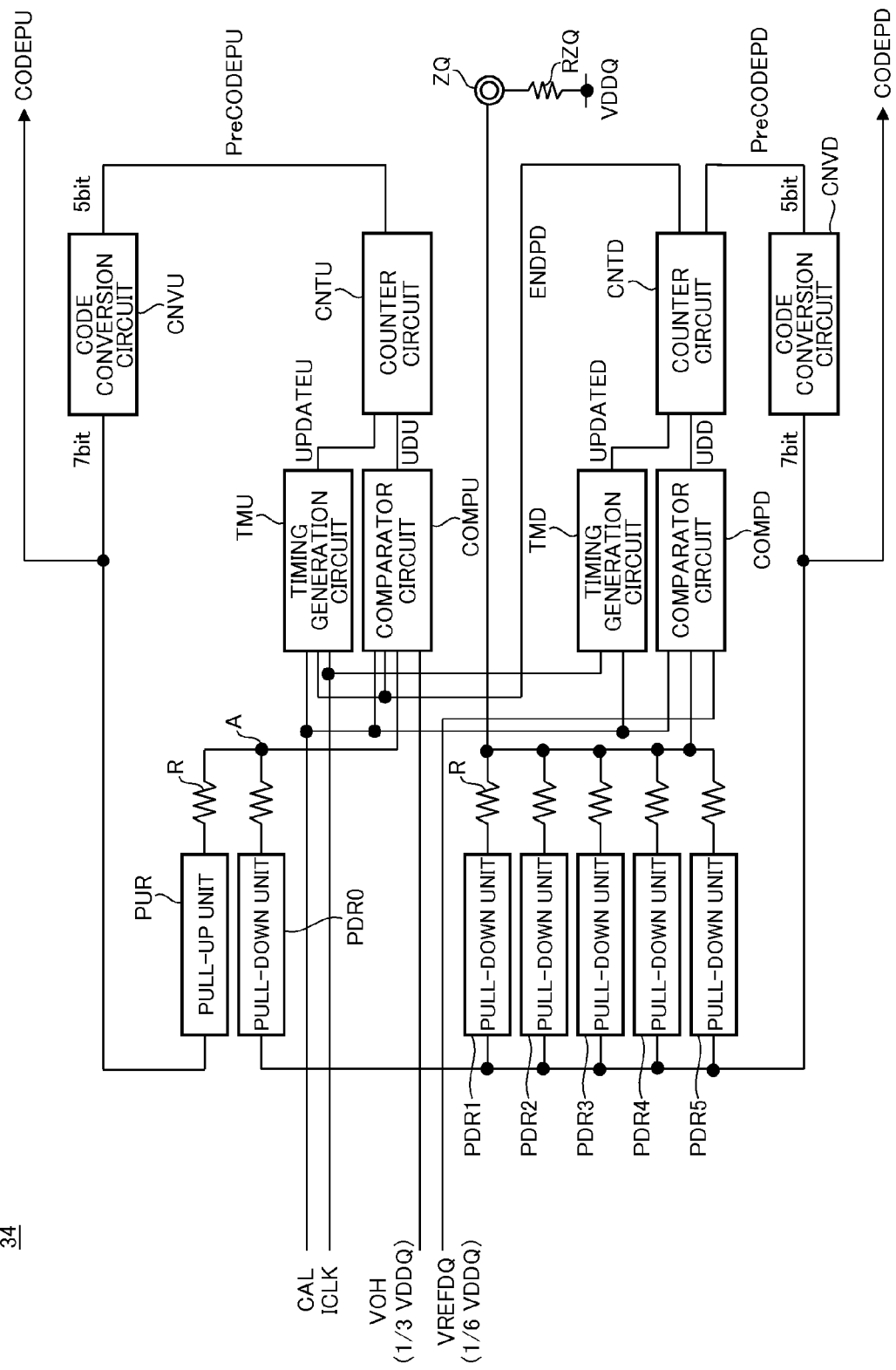
FIG. 8 is a block diagram showing an embodiment of a calibration circuit 34 as shown in FIG. 2.

Turning to FIG. 8, the calibration circuit 34 includes a pull-up unit PUR (which is a replica of the pull-up unit PU), and pull-down units PDR0 to PDR5 (which are replicas of the pull-down unit PD). The pull-up unit PUR has the same circuit configuration as that of the pull-up unit PU, and the impedance thereof is controlled by the code signal CODEPU. Similarly, the pull-down units PDR0 to PDR5 have the same circuit configuration as that of the pull-down unit PD, and the impedance thereof is controlled by the code signal CODEPD.

As shown in FIG. 8, output nodes of the pull-down units PDR1 to PDR5 are connected in common to the calibration terminal ZQ via resistors R, and to a comparator circuit COMPD. The comparator circuit COMPD compares, in response to the activation of the calibration signal CAL, the potential of the calibration terminal ZQ with the reference potential VREFDQ, and generates an up-down signal UDD based on the result thereof. The up-down signal UDD is supplied to a counter circuit CNTD, and a code signal Pre-CODEPD (which is a count value of the counter circuit CNTD) is counted up or down based on the up-down signal UDD. The counting-up or counting-down of the counter circuit CNTD is performed in synchronization with an update signal UPDATED. The update signal UPDATED is generated by a timing generation circuit TMD in synchronization with the internal clock signal ICLK if the calibration signal CAL is activated.

The code signal PreCODEPD is a count value of the counter circuit CNTD, and is a five-bit binary signal. Therefore, the number of values indicated by the code signal Pre-CODEPD is 32. The five-bit code signal PreCODEPD is converted by a code conversion circuit CNVD to a seven-bit code signal CODEPD, and the seven-bit code signal CODEPD is supplied to the pull-down units PD and PDR0 to PDR5.

Furthermore, output nodes of the pull-up unit PUR and pull-down unit PDR0 are connected to a connection point A via resistors R. The connection point A is connected to a comparator circuit COMPU. The comparator circuit COMPU compares, in response to the activation of the calibration signal CAL, the output potential of the pull-up unit PUR and pull-down unit PDR0 (that is, the potential of the connection point A) with the reference potential VOH, and generates an up-down signal UDU based on the result thereof. The up-down signal UDU is supplied to a counter circuit CNTU, and a code signal PreCODEPU, which is a count value of the counter circuit CNTU, is counted up or down based on the up-down signal UDU. The counting-up or counting-down of the counter circuit CNTU is performed in synchronization with an update signal UPDATEU. The update signal UPDATEU is generated by a timing generation circuit TMU in synchronization with the internal clock signal ICLK if the calibration signal CAL and an end signal ENDPD are activated.

The code signal PreCODEPU is a count value of the counter circuit CNTU, and is a five-bit binary signal. Therefore, the number of values indicated by the code signal Pre-CODEPU is 32. The five-bit code signal PreCODEPU is converted by a code conversion circuit CNVU to a seven-bit code signal CODEPU, and the seven-bit code signal CODEPU is supplied to the pull-up units PU and PUR.

According to some embodiments, the calibration operation by the calibration circuit 34 is performed as described below.

First, when the calibration signal CAL is activated, the comparator circuit COMPD becomes activated, and compares the potential of the calibration terminal ZQ and the reference potential VREFDQ. When the result shows that the potential of the calibration terminal ZQ is lower than the reference potential VREFDQ, the counter circuit CNTD will be counted down by the up-down signal UDD, thereby reducing the value of the code signal CODEPD. As a result, the impedance of the pull-down units PDR1 to PDR5 rises, leading to an increase in the potential of the calibration terminal ZQ. When the potential of the calibration terminal ZQ is higher than the reference potential VREFDQ, the counter circuit CNTD will be counted up by the up-down signal UDD, thereby increasing the value of the code signal CODEPD. As a result, the impedance of the pull-down units PDR1 to PDR5 decreases, leading to an drop in the potential of the calibration terminal ZQ.

Such an operation is executed each time the update signal UPDATED becomes activated. As a result, the potential of the calibration terminal ZQ substantially becomes equal to the reference potential VREFDQ. In this case, the level of the reference potential VREFDQ is VDDQ/6, and the five pull-down units PDR1 to PDR5 are connected in parallel to the calibration terminal ZQ. Therefore, as the potential of the calibration terminal ZQ substantially becomes equal to the reference potential VREFDQ, each of the pull-down units PDR1 to PDR5 is adjusted to the same resistance value (RZQ) as that of the reference resistor RZQ. Incidentally, the impedance of the pull-down unit PDR0 is also adjusted to RZQ.

After the calibration operation of the pull-down units PDR1 to PDR5 is finished, the counter circuit CNTD outputs an end signal ENDPD, and then the calibration operation of the pull-up unit PUR starts.

When the end signal ENDPD is activated, the comparator circuit COMPU will become activated, and will compare the potential of the connection point A with the reference potential VOH. When the result shows that the potential of the connection point A is higher than the reference potential VOH, the counter circuit CNTU will be counted down by the up-down signal UDU, thereby reducing the value of the code signal CODEPU. As a result, the impedance of the pull-up unit PUR rises, leading to a decrease in the potential of the connection point A. When the potential of the connection point A is lower than the reference potential VOH, the counter circuit CNTU will be counted up by the up-down signal UDU, thereby increasing the value of the code signal CODEPU. As a result, the impedance of the pull-up unit PUR drops, leading to an increase in the potential of the connection point A.

Such an operation is executed each time the update signal UPDATEU becomes activated. As a result, the potential of the connection point A substantially becomes equal to the reference potential VOH. In this case, the level of the reference potential VOH is VDDQ/3, and the impedance of the pull-down unit PDR0 has already been adjusted to RZQ. Therefore, as the potential of the connection point A substantially becomes equal to the reference potential VOH, the pull-up unit PUR will be adjusted to a resistance value (2RZQ) that is twice as large as that of the reference resistor RZQ.

As described above, a series of calibration operations is completed. Then, the code signals CODEPU and CODEPD, which are generated by the calibration operations, are supplied to the pull-up units PU0 to PU6 and pull-down units PD0 to PD6, which constitute the output buffer OB. As a result, the impedance of the pull-up units PU0 to PU6 is adjusted to 2RZQ, and the impedance of the pull-down units PD0 to PD6 is adjusted to RZQ.

The code conversion circuits CNVD and CNVU will be described below.

Figure 10:
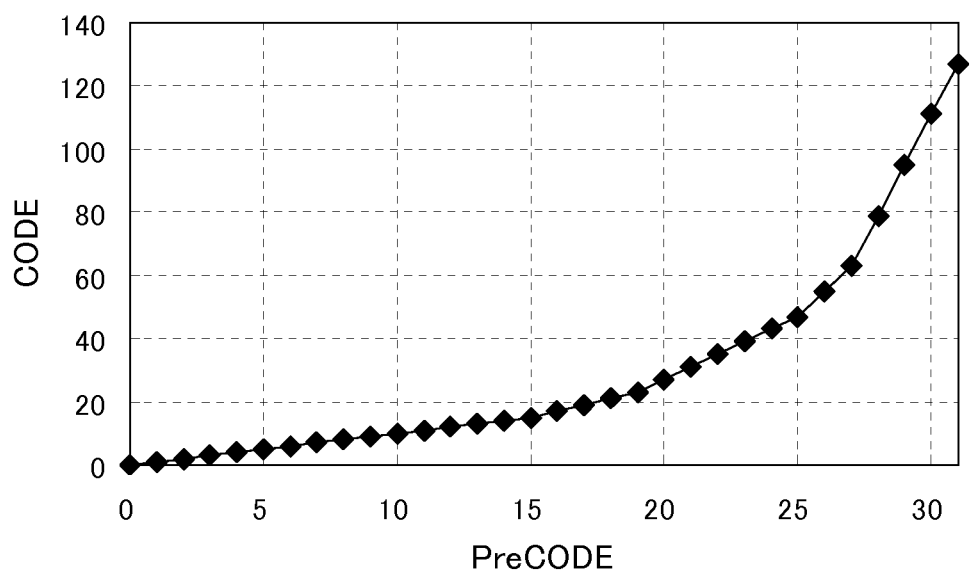
FIG. 10 is a graph showing the relationship between the five-bit code signal PreCODE and the seven-bit code signal CODE, according to various embodiments.

Turning to FIG. 9, the table shows the relationship between the five-bit code signal PreCODE and the seven-bit code signal CODE that have been adjusted in such a way as to be effective for the tendency described in FIG. 16. In FIGS. 9 and 10, the code signals PreCODEPU and PreCODEPD are collectively referred to as code signals PreCODE, and the code signals CODEPU and CODEPD are collectively referred to as code signals CODE.

As shown in FIGS. 9 and 10, the five-bit code signal PreCODE can take 32 values. To each of the values, a value of the seven-bit code signal CODE is assigned. In this case, in a region where the value of the code signal PreCODE is small, a change in the value of the code signal CODE is small at a time when the code signal PreCODE is changed by one pitch (minimum value). As the value of the code signal PreCODE will become larger, a change in the value of the code signal CODE becomes larger at a time when the code signal PreCODE is changed by one pitch (minimum value).

More specifically, if the value of the code signal PreCODE is between 0 to 15, the value of the code signal CODE is changed by "1" at a time when the code signal PreCODE is changed by one pitch. However, if the value of the code signal PreCODE is between 16 and 19, between 20 and 25, between 26 and 27, and between 28 and 31, the value of the code signal CODE is changed by "2", "4", "8", and "16", respectively, at a time when the code signal PreCODE is changed by one pitch. Incidentally, the minimum and maximum values of the converted code signal CODE are 0 and 127, respectively, which are equal to actual minimum and maximum values.

Figure 11:
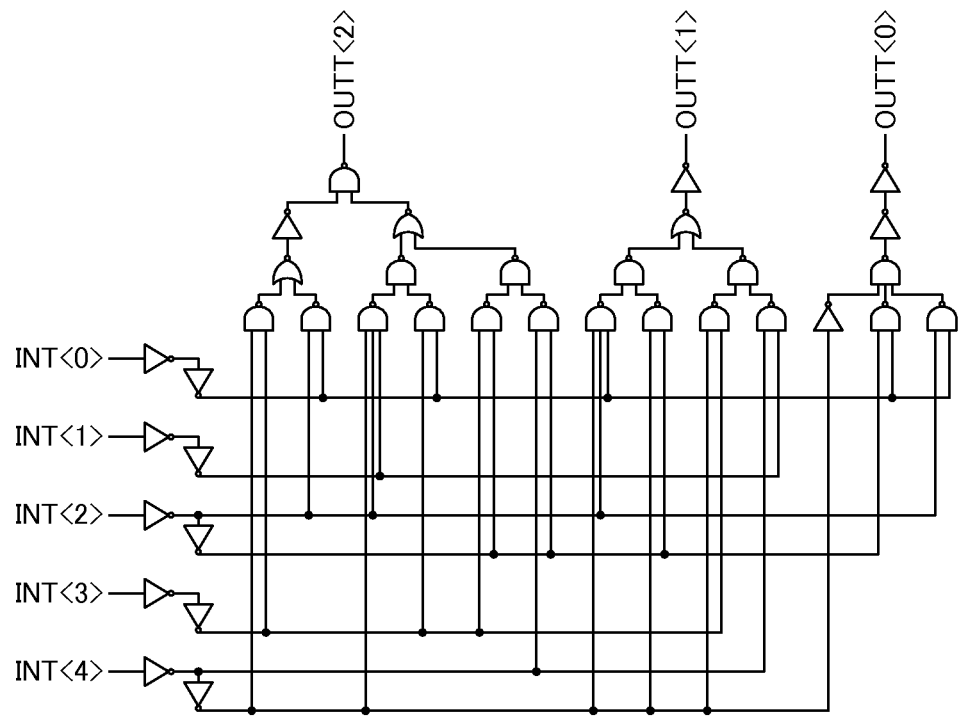
FIG. 11 is a circuit diagram of code conversion circuits CNVD and CNVU as shown in FIG. 8.
Figure 11:
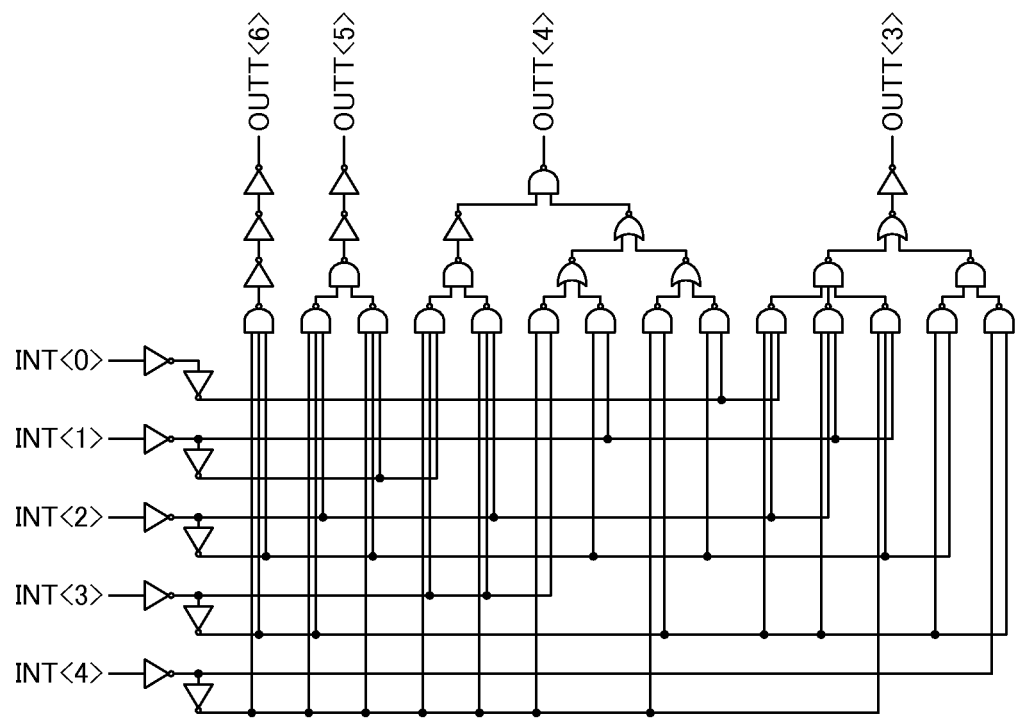

Turning to FIG. 11, a specific logic circuit that performs the above conversion is shown. Bits INT<0> to INT<4> as shown in FIG. 11 are bits that constitute the five-bit code signal PreCODE. Bits OUTT<0> to OUTT<6> as shown in FIG. 11 are bits that constitute the seven-bit code signal CODE.

Such a code conversion helps to keep the number of selectable values of impedance at 32, and to increase resolution in the region where the value of the code signal CODE is small (or the region where the impedance is high and the value of current is small). That is, as described above with reference to FIG. 16, in the region where the impedance is high and the value of current is small, the resolution of impedance tends to be insufficient. However, according to some embodiments, the resolution is increased in that region. Moreover, the number of selectable values of impedance is kept low. Therefore, the time required for the calibration operation does not increase.

Figure 12:
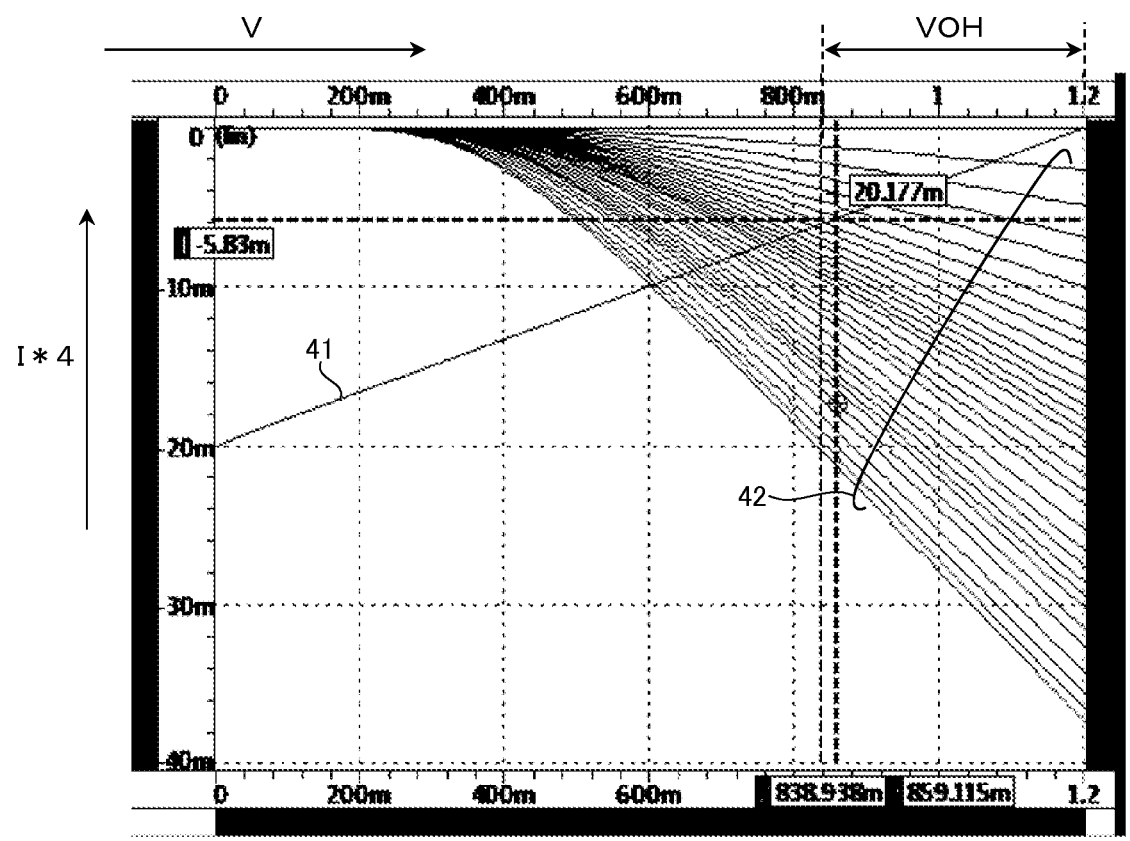
FIG. 12 is a graph showing the relationship between the value of a converted code signal CODE and a current I that flows through the data input/output terminals DQ, according to various embodiments.

Turning to FIG. 12, the horizontal axis represents potential, and the vertical axis represents current, and in order to make the diagrams easy to understand, the value of the current is quadrupled. Moreover, reference symbol 41 represents the current-voltage characteristics of the resistor RZQ, and reference symbol 42 represents the current-voltage characteristics of the pull-up unit PU. As shown in FIG. 12, according to some embodiments, since the code signals PreCODE are converted by the code conversion circuits CNVD and CNVU to the code signals CODE, the distances between impedance lines are equalized. More specifically, in the region where the value of the code signal CODE is small (or the region where the impedance is high and the value of current is small), it is possible to achieve the same level of resolution as in a case when the seven-bit code signal CODE shown in FIG. 16B is used. In the region where the value of the code signal CODE is large (or the region where the impedance is small and the value of current is large), the thinning-out is performed to keep the resolution from being excessive, and the pitch is expanded.

Therefore, it is possible to prevent an increase in the time required for the calibration operation, as well as to achieve a high level of impedance resolution. Moreover, during the calibration operation in which the pull-down units PDR0 to PDR5 are used, the calibration circuit 34 of some embodiments uses the reference potential VREFDQ, which is a threshold value, as a reference. Therefore, the cross point of the read data can be accurately adjusted to VDDQ/6, which is a threshold value.

Another embodiment will be described below.

Figure 13:
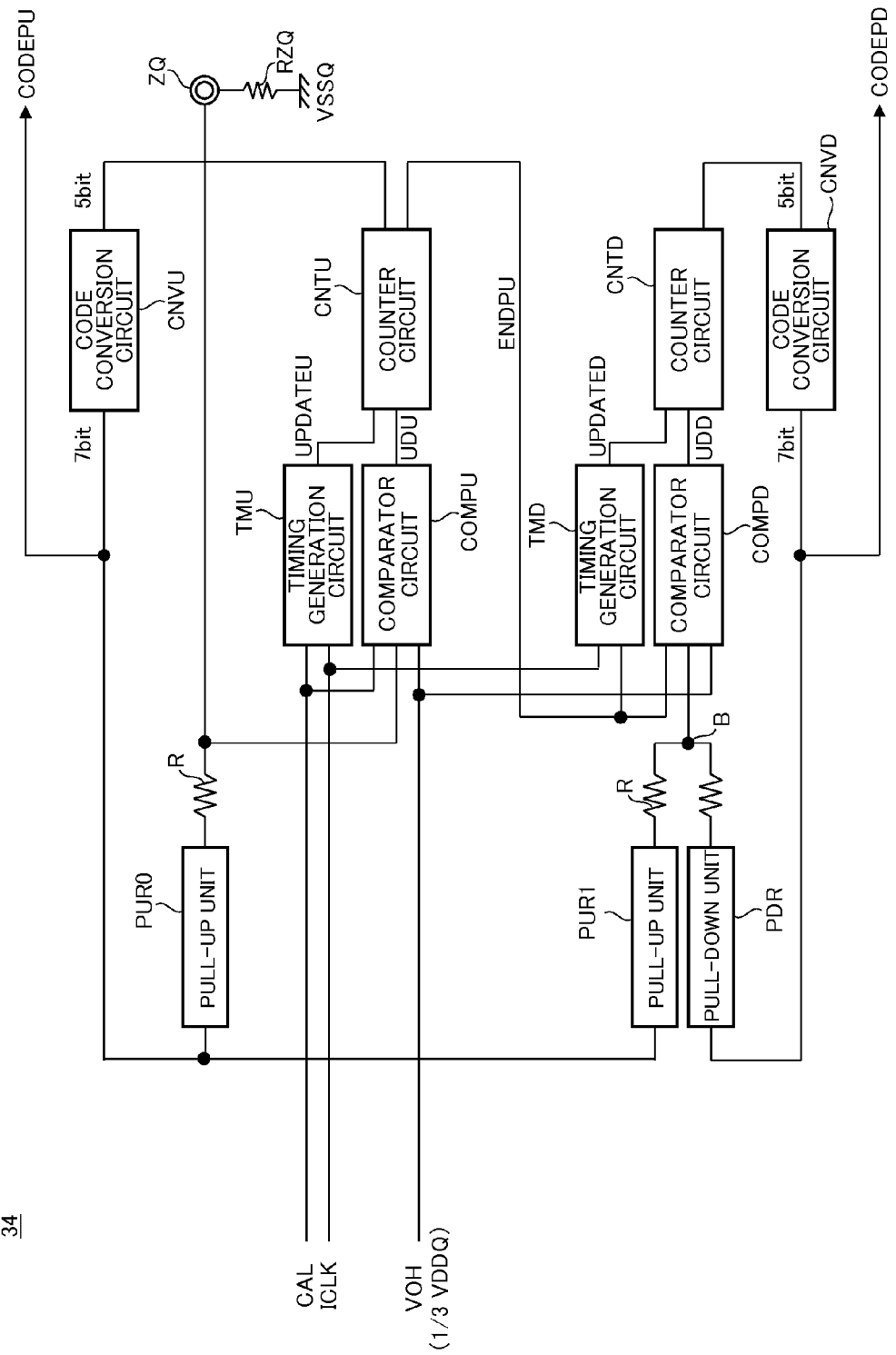
FIG. 13 is a block diagram showing a calibration circuit 34, according to various embodiments.

Turning to FIG. 13, components the same as those as shown in FIG. 8 are represented by the same reference symbols, and thus, redundant description will be omitted.

The calibration circuit 34 of the embodiment shown in FIG. 13 includes pull-up units PUR0 and PUR1, which are replicas of the pull-up unit PU, and a pull-down unit PDR, which is a replica of the pull-down unit PD. An output node of the pull-up unit PUR0 is connected to the calibration terminal ZQ via a resistor R, and is connected to a comparator circuit COMPU. Output nodes of the pull-up unit PUR1 and pull-down unit PDR are connected to a connection point B via resistors R. The connection point B is connected to a comparator circuit COMPD.

According to this embodiment, the reference resistor RZQ that is connected to the calibration terminal ZQ is connected to the ground potential VSSQ. To the comparator circuits COMPU and COMPD, the reference potential VOH is supplied. The end signal ENDPU is generated by the counter circuit CNTU, and is supplied to the timing generation circuit TMD and the comparator circuit COMPD. The rest of the configuration is basically the same as that of the calibration circuit 34 of the embodiment shown in FIG. 8.

According to this embodiment, the calibration operation is performed by the calibration circuit 34 as described below.

First, when the calibration signal CAL is activated, the comparator circuit COMPU becomes activated, and compares the potential of the calibration terminal ZQ and the reference potential VOH. Then, the code signal CODEPU is changed due to the operation of the timing generation circuit TMU and counter circuit CNTU, and, finally, the potential of the calibration terminal ZQ substantially becomes equal to the reference potential VOH. In this case, the level of the reference potential VOH is VDDQ/3. Therefore, when the potential of the calibration terminal ZQ substantially becomes equal to the reference potential VOH, the pull-up unit PUR0 is adjusted to a resistance value (2RZQ) that is twice as large as that of the reference resistor RZQ. Incidentally, the impedance of the pull-up unit PUR1 is also adjusted to 2RZQ.

When the calibration operation of the pull-up unit PUR0 is completed, the counter circuit CNTU outputs an end signal ENDPU, and then the calibration operation of the pull-down unit PDR starts.

When the end signal ENDPU is activated, the comparator circuit COMPD becomes activated, and compares the potential of the connection point B with the reference potential VOH. Then, the code signal CODEPD is changed due to the operation of the timing generation circuit TMD and counter circuit CNTD, and, finally, the potential of the connection point B substantially becomes equal to the reference potential VOH. In this case, the level of the reference potential VOH is VDDQ/3, and the impedance of the pull-up unit PUR1 has already been adjusted to 2RZQ. Therefore, as the potential of the connection point B substantially becomes equal to the reference potential VOH, the pull-down unit PDR is adjusted to the same resistance value (RZQ) as that of the reference resistor RZQ.

As described above, a series of calibration operations are completed. Then, the code signals CODEPU and CODEPD, which are generated by the calibration operations, are supplied to the pull-up units PU0 to PU6 and pull-down units PD0 to PD6, which constitute the output buffer OB. As a result, the impedance of the pull-up units PU0 to PU6 is adjusted to 2RZQ, and the impedance of the pull-down units PD0 to PD6 is adjusted to RZQ.

Even in this embodiment, the code conversion circuits CNVD and CNVU convert the code signals. Therefore, as in the case of the prior embodiment, it is possible to prevent an increase in the time required for the calibration operation, as well as to achieve a high level of impedance resolution.

Moreover, the calibration circuit 34 of this embodiment has fewer replica units than those of the calibration circuit 34 shown in FIG. 8. Therefore, the occupied area on the chip can be reduced. Moreover, the reference potential VOH is used to adjust the impedance of the pull-down unit PDR. Therefore, the calibration operation can be performed regardless of what the actual value of the reference potential VOH will be. Moreover, even if the reference potential VREFDQ is not equal to a value calculated by dividing the power supply potential VDDQ by an integer, the calibration operation can be performed by one pull-down unit PDR.

Yet another embodiment will be described below.

Figure 14:
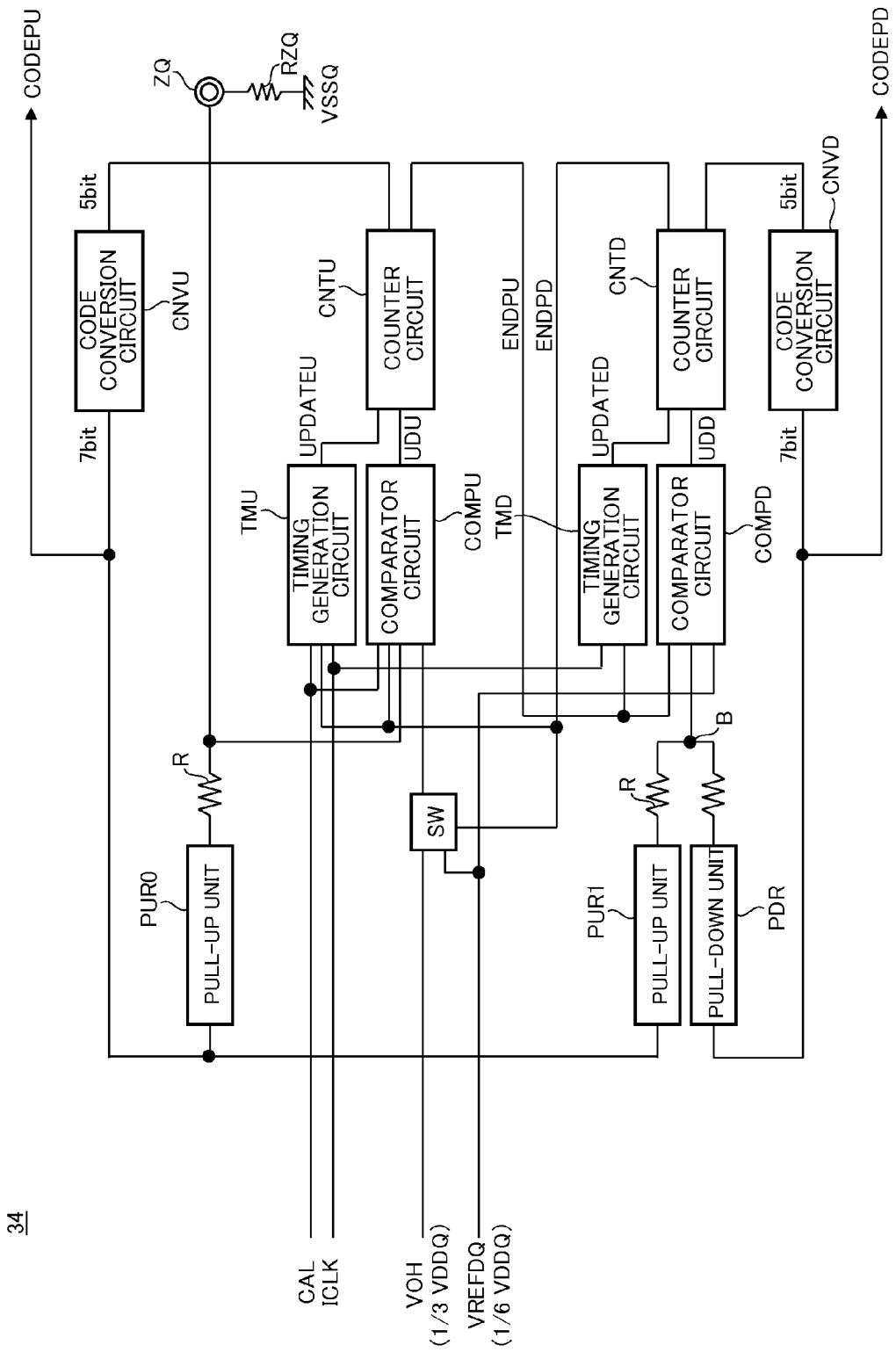
FIG. 14 is a block diagram showing a calibration circuit 34, according to various embodiments.

Turning to FIG. 14, the calibration circuit 34 of this embodiment includes a switch circuit SW that receives the reference potentials VREFDQ and VOH. To the switch circuit SW, the end signal ENDPD is supplied. Based on the end signal ENDPD, the switch circuit SW supplies either the reference potential VREFDQ or VOH to the comparator circuit COMPU. Moreover, to the comparator circuit COMPD, the reference potential VREFDQ is supplied. The rest of the configuration is the same as that of the calibration circuit 34 of the embodiment shown in FIG. 13. Accordingly, the same components are represented by the same reference symbols, and thus, redundant description will be omitted.

The calibration operation by the calibration circuit 34 of this embodiment is performed as described below.

First, when the calibration signal CAL is activated, the switch circuit SW selects the reference potential VREFDQ, and the comparator circuit COMPU becomes activated to compare the potential of the calibration terminal ZQ with the reference potential VREFDQ. Then, the code signal CODEPU is changed due to the operation of the timing generation circuit TMU and counter circuit CNTU, and, finally, the potential of the calibration terminal ZQ substantially becomes equal to the reference potential VREFDQ. In this case, the level of the reference potential VREFDQ is VDDQ/6. Therefore, when the potential of the calibration terminal ZQ substantially becomes equal to the reference potential VREFDQ, the pull-up unit PUR0 is adjusted to a resistance value (5RZQ) five times as large as that of the reference resistor RZQ. Incidentally, the impedance of the pull-up unit PUR1 is also adjusted to 5RZQ.

When the calibration operation of the pull-up unit PUR0 is completed, the counter circuit CNTU outputs an end signal ENDPU, and the calibration operation of the pull-down unit PDR starts.

When the end signal ENDPU is activated, the comparator circuit COMPD becomes activated to compare the potential of the connection point B with the reference potential VREFDQ. Then, the code signal CODEPD is changed due to the operation of the timing generation circuit TMD and counter circuit CNTD, and, finally, the potential of the connection point B substantially becomes equal to the reference potential VREFDQ. In this case, the level of the reference potential VREFDQ is VDDQ/6, and the impedance of the pull-up unit PUR1 already has been adjusted to 5RZQ. Therefore, when the potential of the connection point B substantially becomes equal to the reference potential VREFDQ, the pull-down unit PDR is adjusted to the same resistance value (RZQ) as that of the reference resistance RZQ.

When the calibration operation of the pull-down unit PDR is finished, the counter circuit CNTD outputs an end signal ENDPD, and a re-calibration operation of the pull-up unit PUR0 starts.

When the end signal ENDPD becomes activated, the switch circuit SW selects the reference potential VOH, and the comparator circuit COMPU becomes activated again to compare the potential of the calibration terminal ZQ and the reference potential VOH. Then, the code signal CODEPU is changed due to the operation of the timing generation circuit TMU and counter circuit CNTU, and, finally, the potential of the calibration terminal ZQ becomes substantially equal to the reference potential VOH. In this case, the level of the reference potential VOH is VDDQ/3. Therefore, when the potential of the calibration terminal ZQ becomes substantially equal to the reference potential VOH, the pull-up unit PUR0 is adjusted to a resistance value (2RZQ) two times as large as that of the reference resistor RZQ.

As described above, a series of calibration operations are completed. Then, the code signals CODEPU and CODEPD, which are generated by the calibration operations, are supplied to the pull-up units PU0 to PU6 and pull-down units PD0 to PD6, which constitute the output buffer OB. As a result, the impedance of the pull-up units PU0 to PU6 is adjusted to 2RZQ, and the impedance of the pull-down units PD0 to PD6 is adjusted to RZQ.

Even in this embodiment, the code conversion circuits CNVD and CNVU convert the code signals. Therefore, as in the case of the prior embodiments, it is possible to prevent an increase in the time required for the calibration operation, as well as to achieve a high level of impedance resolution.

Furthermore, the calibration circuit 34 of this embodiment not only can achieve the advantageous effects of the calibration circuit 34 of the prior embodiment, but also can accurately adjust, as in the case of some embodiments, the cross point of the read data to the threshold value or VDDQ/6 as this calibration circuit 34 uses the reference potential VREFDQ for calibration of the pull-down unit PDR.

It is apparent that the present description is not limited to the above embodiments, but may be modified and changed without departing from the scope of the disclosure.

For example, the semiconductor device 10 of each embodiment is described as the LPDDR4-type DRAM. However, a calibration circuit and an output buffer can similarly be provided in the controller 8, and the teachings of this disclosure may be applied to these components. Needless to say, a calibration circuit and an output buffer can similarly be provided in memories other than DRAM, such as flash memories, ReRAM, FeRAM, and STT-RAM, and the teachings of this disclosure may be applied to these components.

Moreover, according to the above embodiments, the five-bit code signals PreCODE are converted to the seven-bit code signals CODE. However, the number of bits of the code signals before or after the code conversion is not limited to 5 or 7.

The pull-up unit PU as shown in FIG. 6 includes N-channel MOS transistors TNU0 to TNU6. Instead, the pull-up unit PU may include P-channel MOS transistors.

Figure 17:
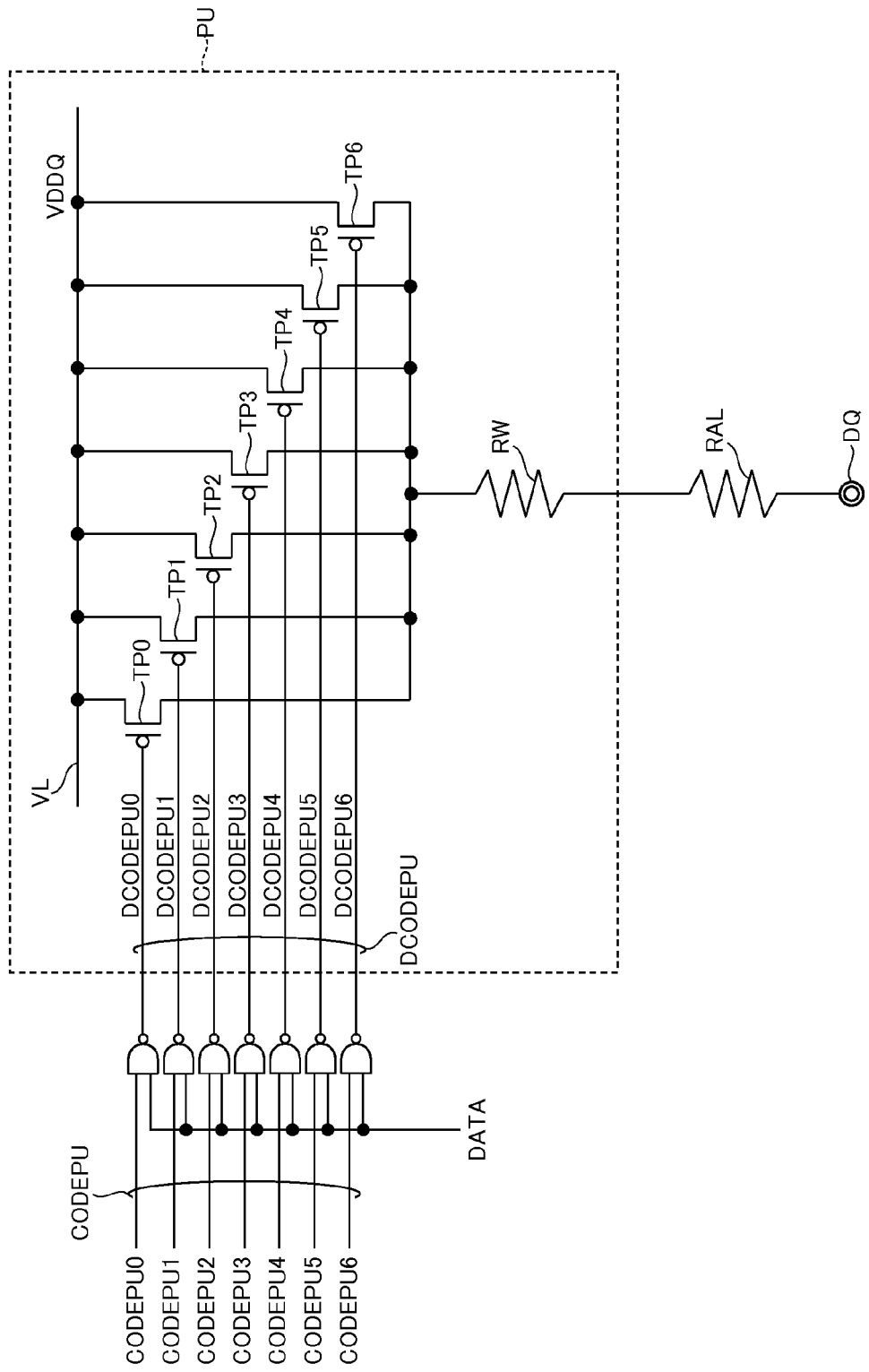
FIG. 17 is a circuit diagram showing a pull-up unit PU, according to various embodiments.

Turning now to FIG. 17, it can be seen that the pull-up unit PU includes seven P-channel MOS transistors TP0 to TP6, which are connected in parallel; and resistors RW and RAL. The sources of the transistors TP0 to TP6 are connected in common to a power supply line VL, which supplies the power supply potential VDDQ. The drains of the transistors TP0 to TP6 are connected to a data input/output terminal DQ via the resistors RW and RAL.

To the gate electrodes of the transistors TP0 to TP6, the bits constituting the code control signal DCODEPU (DCODEPU0 to DCODEPU6) are respectively supplied. Accordingly, the seven transistors TP0 to TP6 are separately controlled based on the value of the code control signal DCODEPU in such a way as to be turned ON/OFF. As shown in FIG. 17, the code control signal DCODEPU is a signal that NAND gate circuits have generated by logically combining each bit of the code signal CODEPU and the internal data DATA. When the internal data DATA indicates a low level, all the bits DCODEPU0 to DCODEPU6 that constitute the code control signal DCODEPU are at a high level regardless of what the value of the code signal CODEPU is. As a result, all the transistors TP0 to TP6 are OFF. When the internal data DATA indicates a high level, the value of the code signal CODEPU is directly used as the value of the code control signal DCODEPU. As a result, some of the transistors TP0 to TP6 are ON.

In this case, the ratios (W/L ratios) of a channel width (W) to a channel length (L) of the transistors TP0 to TP6, or their current supply capacities, are weighted by the power of 2. More specifically, if the W/L ratio of the transistor TP0 is 1WLp, the W/L ratio of the transistor TPk (k=0 to 6) is designed so as to be $2^k \times$ WLp. Therefore, the impedance of the pull-up unit PU can be adjusted in up to 128 stages. However, according to the above-described embodiments, the number of adjustable values of the impedance of the pull-up unit PU can be thinned out to 32 stages.

CONCLUSION

In some embodiments, a semiconductor device may include: a data output terminal; an output buffer including n first transistors (n is a natural number greater than or equal to 2) connected in parallel with the data output terminal; and a calibration circuit outputting an n-bit first code signal for controlling each of the n first transistors, wherein the calibration circuit includes a first counter circuit outputting a k-bit second code signal (k is a natural number less than n), and a first code conversion circuit converting the k-bit second code signal to the n-bit first code signal.

In some embodiments, a semiconductor device may include: a power supply line; a data output terminal; a calibration terminal; an output buffer connected between the power supply line and the data output terminal, impedance of the output buffer varying according to a value of a first code signal; a counter circuit generating a second code signal based on potential of the calibration terminal; and a code conversion circuit converting the second code signal to the first code signal, wherein the code conversion circuit changes, if a value of the second code signal is within a first range, a value of the first code signal by a first pitch at a time when the value of the second code signal is changed by one pitch, and the code conversion circuit changes, if the value of the second code signal is within a second range that is different from the first range, the value of the first code signal by a second pitch that is larger than the first pitch at a time when the value of the second code signal is changed by one pitch.

According to the various embodiments, it becomes possible to perform calibration operations in a relatively short time, while improving the level of impedance-adjustment accuracy.

What is claimed is:

1. A semiconductor device comprising:
   a data output terminal;
   an output buffer including n first transistors connected in parallel with the data output terminal, wherein n is a natural number greater than 1; and
   a calibration circuit to output an n-bit first code signal to control each of the n first transistors,
   wherein the calibration circuit includes a first counter circuit to output a k-bit second code signal, and a first code conversion circuit to convert the k-bit second code signal to the n-bit first code signal, wherein k is a natural number less than n, and
   wherein current drive capabilities of the n first transistors are weighted by the power of 2.

2. The semiconductor device as claimed in claim 1, further comprising a first power supply line to supply a first power supply potential,
   wherein the n first transistors are connected in parallel between the first power supply line and the data output terminal.

3. The semiconductor device as claimed in claim 2,
   wherein the output buffer further includes m second transistors connected in parallel with the data output terminal, wherein m is a natural number greater than 1,
   wherein the calibration circuit further includes a second counter circuit to output a p-bit fourth code signal, and a second code conversion circuit to convert the p-bit fourth code signal to a m-bit third code signal, wherein p is a natural number less than m, and
   wherein the m second transistors are respectively controlled by m bits of the m-bit third code signal.

4. The semiconductor device as claimed in claim 3, further comprising a second power supply line to supply a second power supply potential that is different from the first power supply potential,
   wherein the m second transistors are connected in parallel between the second power supply line and the data output terminal.

5. The semiconductor device as claimed in claim 4, wherein the n first transistors have a first conductivity type, and the m second transistors have a second conductivity type that is different from the first conductivity type.

6. A semiconductor device comprising:
   a data output terminal;
   an output buffer including n first transistors connected in parallel with the data output terminal, wherein n is a natural number greater than 1; and
   a calibration circuit to output an n-bit first code signal to control each of the n first transistors,
   wherein the calibration circuit includes a first counter circuit to output a k-bit second code signal, and a first code conversion circuit to convert the k-bit second code signal to the n-bit first code signal, wherein k is a natural number less than n, wherein the first code conversion circuit is to change, when a value of the k-bit second code signal is within a first range, a value of the n-bit first code signal by a first value at a time when the value of the k-bit second code signal is changed by a minimum value, and wherein the first code conversion circuit is to change, when the value of the k-bit second code signal is within a second range that is different from the first range, the value of the n-bit first code signal by a second value that is larger than the first value at a time when the value of the k-bit second code signal is changed by the minimum value.

7. The semiconductor device as claimed in claim 6, wherein the first code conversion circuit is to change, when the value of the k-bit second code signal is within a third range that is different from the first and second ranges, the value of the n-bit first code signal by a third value that is larger than the second value at a time when the value of the k-bit second code signal is changed by the minimum value.

8. The semiconductor device as claimed in claim 6, wherein impedance of the output buffer is to decrease as the value of the n-bit first code signal increases.

9. A semiconductor device comprising:
a data output terminal;
an output buffer including n first transistors connected in parallel with the data output terminal, wherein n is a natural number greater than 1;
a calibration circuit to output an n-bit first code signal to control each of the n first transistors, wherein the calibration circuit includes a first counter circuit to output a k-bit second code signal, and a first code conversion circuit to convert the k-bit second code signal to the n-bit first code signal, wherein k is a natural number less than n; and
a calibration terminal,
wherein the calibration circuit further includes a first replica circuit having n third transistors that respectively replicate the n first transistors and are respectively controlled in response to the n-bit first code signal, and a first comparator circuit that is to control the first counter circuit,
wherein the first replica circuit is connected to the calibration terminal, and
wherein the first comparator circuit is to compare a potential of the calibration terminal with a first reference potential, and is to control, based on a result thereof, the first counter circuit.

10. The semiconductor device as claimed in claim 3, further comprising a calibration terminal, wherein
the calibration circuit further includes a plurality of first replica circuits each having n third transistors that respectively replicate the n first transistors and are respectively controlled in response to the n-bit first code signal, and a first comparator circuit that is to control the first counter circuit,
wherein the first replica circuits are connected in parallel with the calibration terminal, and
wherein the first comparator circuit is to compare a potential of the calibration terminal with a first reference potential, and is to control, based on a result thereof, the first counter circuit.

11. The semiconductor device as claimed in claim 10, wherein the calibration circuit further includes a second replica circuit having n fourth transistors that respectively replicate the n first transistors and are respectively controlled in response to the n-bit first code signal, a third replica circuit having m fifth transistors that respectively replicate the m second transistors and are respectively controlled in response to the m-bit third code signal, and a second comparator circuit that is to control the second counter circuit, wherein the second and third replica circuits are connected to a connection node, and wherein the second comparator circuit is to compare a potential of the connection node with a second reference potential, and is to control, based on a result thereof, the second counter circuit.

12. The semiconductor device as claimed in claim 11, wherein a difference between the first power supply potential and the first reference potential is substantially a half of a difference between the first power supply potential and the second reference potential.

13. The semiconductor device as claimed in claim 3, further comprising a calibration terminal, wherein
the calibration circuit further includes a first and a second replica circuit each having n third transistors that respectively replicate the n first transistors and are respectively controlled in response to the n-bit first code signal, a third replica circuit having m fourth transistors that respectively replicate the m second transistors and are respectively controlled in response to the m-bit third code signal, a first comparator circuit that is to control the first counter circuit, and a second comparator circuit that is to control the second counter circuit,
wherein the first replica circuit is connected to the calibration terminal,
wherein the second and third replica circuits are connected to a connection node,
wherein the first comparator circuit is to compare a potential of the calibration terminal with a first reference potential, and is to control, based on a result thereof, the first counter circuit, and
wherein the second comparator circuit is to compare a potential of the connection node with a second reference potential, and is to control, based on a result thereof, the second counter circuit.

14. The semiconductor device as claimed in claim 13, wherein the first reference potential is substantially equal to the second reference potential.

15. The semiconductor device as claimed in claim 13, further comprising a switch circuit to switch levels of the first reference potential.

16. The semiconductor device as claimed in claim 15, wherein the switch circuit is to switch levels of the first reference potential so that the first reference potential is substantially equal to the second reference potential so that the first reference potential is different from the second reference potential.

17. The semiconductor device as claimed in claim 13, wherein the first and second reference potentials are substantially equal to each other, and are different from an intermediate potential of the first and second power supply potentials.

18. A semiconductor device comprising:
a power supply line;
a data output terminal;
a calibration terminal;

an output buffer connected between the power supply line and the data output terminal, wherein an impedance of the output buffer is to vary according to a value of a first code signal;

a counter circuit to generate a second code signal based on a potential of the calibration terminal; and a code conversion circuit to convert the second code signal to the first code signal, wherein the code conversion circuit is to change, if a value of the second code signal is within a first range, a value of the first code signal by a first pitch at a time when the value of the second code signal is changed by one pitch, and wherein the code conversion circuit is to change, if the value of the second code signal is within a second range that is different from the first range, the value of the first code signal by a second pitch that is larger than the first pitch at a time when the value of the second code signal is changed by one pitch.

19. The semiconductor device as claimed in claim 18, wherein impedance of the output buffer is to decrease as the value of the first code signal increases.

* * * * *